(12) United States Patent
Kudo et al.

(10) Patent No.: US 11,830,872 B2
(45) Date of Patent: Nov. 28, 2023

(54) SEMICONDUCTOR DEVICE

(71) Applicant: Mitsubishi Electric Corporation, Tokyo (JP)

(72) Inventors: Kazuki Kudo, Tokyo (JP); Hidenori Fujii, Tokyo (JP); Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/227,612

(22) Filed: Apr. 12, 2021

(65) Prior Publication Data

US 2022/0102341 A1    Mar. 31, 2022

(30) Foreign Application Priority Data

Sep. 30, 2020  (JP) ................................. 2020-164288

(51) Int. Cl.
*H01L 27/06* (2006.01)
*H01L 29/06* (2006.01)
(Continued)

(52) U.S. Cl.
CPC ...... *H01L 27/0664* (2013.01); *H01L 29/0623* (2013.01); *H01L 29/1095* (2013.01);
(Continued)

(58) Field of Classification Search
CPC ............. H01L 29/7803; H01L 29/7804; H01L 29/7805; H01L 29/7808
See application file for complete search history.

(56) References Cited

U.S. PATENT DOCUMENTS 9,887,285 B1\* 2/2018 Oota ................... H01L 29/7805
2010/0156506 A1 6/2010 Tsuzuki et al.
(Continued)

FOREIGN PATENT DOCUMENTS

DE   10 2009 055 322 A1   8/2010
JP   2010-192597 A        9/2010
(Continued)

OTHER PUBLICATIONS

An Office Action issued by the German Patent Office dated Aug. 12, 2022, which corresponds to German Patent Application No. 102021117663.8 and is related to U.S. Appl. No. 17/227,612; with English language translation.
(Continued)

*Primary Examiner* — Jesse Y Miyoshi
(74) *Attorney, Agent, or Firm* — Studebaker & Brackett PC

(57) ABSTRACT

A semiconductor device according to the present disclosure is an RC-IGBT in which an IGBT region 10 and a diode region 20 are provided adjacent to each other. The diode region 20 includes a p-type anode layer 25 provided on a first principal surface side of an $n^-$-type drift layer 1, a p-type contact layer 24 provided on the first principal surface side of the p-type anode layer 25 and at a surface layer of a semiconductor substrate on the first principal surface side and connected with an emitter electrode 6, and an $n^+$-type cathode layer 26 provided at a surface layer of the semiconductor substrate on a second principal surface side. The p-type contact layer 24 contains aluminum as p-type impurities, and the thickness of the p-type contact layer 24 is smaller than the thickness of an $n^+$-type source layer 13 provided in the IGBT region 10.

19 Claims, 22 Drawing Sheets

A-A CROSS SECTION

(51) Int. Cl.
*H01L 29/10* (2006.01)
*H01L 29/66* (2006.01)
*H01L 29/861* (2006.01)
*H01L 29/739* (2006.01)
*H01L 29/78* (2006.01)

(52) U.S. Cl.
CPC .... *H01L 29/66348* (2013.01); *H01L 29/7397* (2013.01); *H01L 29/7805* (2013.01); *H01L 29/8613* (2013.01)

(56) References Cited

U.S. PATENT DOCUMENTS

| | | |
|---|---|---|
| 2012/0043581 A1 | 2/2012 | Koyama et al. |
| 2014/0048847 A1* | 2/2014 | Yamashita .......... H01L 29/8611 257/140 |
| 2014/0070266 A1 | 3/2014 | Matsudai et al. |
| 2015/0155277 A1 | 6/2015 | Ogura et al. |
| 2016/0056251 A1* | 2/2016 | Laven ............... H01L 29/42376 257/326 |
| 2017/0141103 A1* | 5/2017 | Kameyama ......... H01L 29/1095 |
| 2018/0374948 A1 | 12/2018 | Naito |
| 2019/0206860 A1 | 7/2019 | Kamimura et al. |
| 2021/0296444 A1 | 9/2021 | Kimura |

FOREIGN PATENT DOCUMENTS

| | | |
|---|---|---|
| JP | 2010-278164 A | 12/2010 |
| JP | 2012-043890 A | 3/2012 |
| JP | 2014-056942 A | 3/2014 |
| JP | 2015-109341 A | 6/2015 |
| JP | 2017-168579 A | 9/2017 |
| JP | 2019-121786 A | 7/2019 |
| WO | 2018/052098 A1 | 3/2018 |
| WO | 2020/012605 A1 | 1/2020 |
| WO | 2020/129186 A1 | 6/2020 |

OTHER PUBLICATIONS

An Office Action; "Notice of Reasons for Refusal," mailed by the Japanese Patent Office dated Sep. 5, 2023, which corresponds to Japanese Patent Application No. 2020-164288 and is related to U.S. Appl. No. 17/227,612; with English language translation.

* cited by examiner

C-C CROSS SECTION

D-D CROSS SECTION

G-G CROSS SECTION

G-G CROSS SECTION

G-G CROSS SECTION

G-G CROSS SECTION

SEMICONDUCTOR DEVICE

BACKGROUND OF THE INVENTION

Field

The present disclosure relates to a semiconductor device.

Background

Conventionally, a reverse conducting IGBT (RC-IGBT) as a semiconductor device in which an insulated gate bipolar transistor (IGBT) and a freewheeling diode are formed in one semiconductor substrate has been disclosed. In such a semiconductor device, a p+-type contact layer having high impurity concentration is provided at a surface layer of an anode part in a diode region to reduce contact resistance between a surface electrode and the anode part (refer to JP 2010-192597 A, for example).

However, when the p+-type contact layer is provided at the anode part in the diode region, the amount of hole injection from the anode part increases in diode operation, and a recovery loss increases, which has been a problem.

SUMMARY

The present disclosure is intended to solve the above-described problem and obtain a semiconductor device in which the recovery loss of a diode region of an RC-IGBT is reduced.

The features and advantages of the present disclosure may be summarized as follows.

According to one aspect of the present disclosure, a semiconductor device includes an insulated gate bipolar transistor region and a diode region provided adjacent to each other in a semiconductor substrate including an n-type drift layer between a first principal surface and a second principal surface opposite to the first principal surface and an emitter electrode provided on the first principal surface of the semiconductor substrate, wherein the insulated gate bipolar transistor region includes a p-type base layer provided on the first principal surface side of the drift layer, an n-type source layer selectively provided on the first principal surface side of the base layer and at a surface layer of the semiconductor substrate on the first principal surface side, a p-type first contact layer provided on the first principal surface side of the base layer and in a region in which the source layer is not provided on the surface layer of the semiconductor substrate on the first principal surface side, the first contact layer being connected with the emitter electrode, a gate trench insulating film provided on an inner surface of a trench penetrating through the base layer to the drift layer, a gate trench electrode provided in the trench through the gate trench insulating film, and a p-type collector layer provided at a surface layer of the semiconductor substrate on the second principal surface side, the diode region includes a p-type anode layer provided on the first principal surface side of the drift layer, a p-type second contact layer provided on the first principal surface side of the anode layer and at the surface layer of the semiconductor substrate on the first principal surface side and connected with the emitter electrode, and an n-type cathode layer provided at the surface layer of the semiconductor substrate on the second principal surface side, and the second contact layer contains aluminum as p-type impurities.

Other and further objects, features and advantages of the disclosure will appear more fully from the following description.

DESCRIPTION OF EMBODIMENTS

Embodiments will be described below with reference to the accompanying drawings. In drawings described below, parts identical or equivalent to each other are denoted by an identical reference sign, and duplicate description thereof is omitted. In the following description, terms "up" and "down", which mean particular directions, are used in some cases, but these terms are used for convenience and not related to directions when the present disclosure is actually performed.

In the following description, n and p indicate the conduction types of a semiconductor. In addition, n− indicates impurity concentration lower than that of n, and n+ indicates impurity concentration higher than that of n. Similarly, p− indicates impurity concentration lower than that of p, and p+ indicates impurity concentration higher than that of p.

First Embodiment

The following describes a semiconductor device and method of manufacturing the semiconductor device of a first embodiment with reference to FIGS. 1 to 16.

Figure 1:
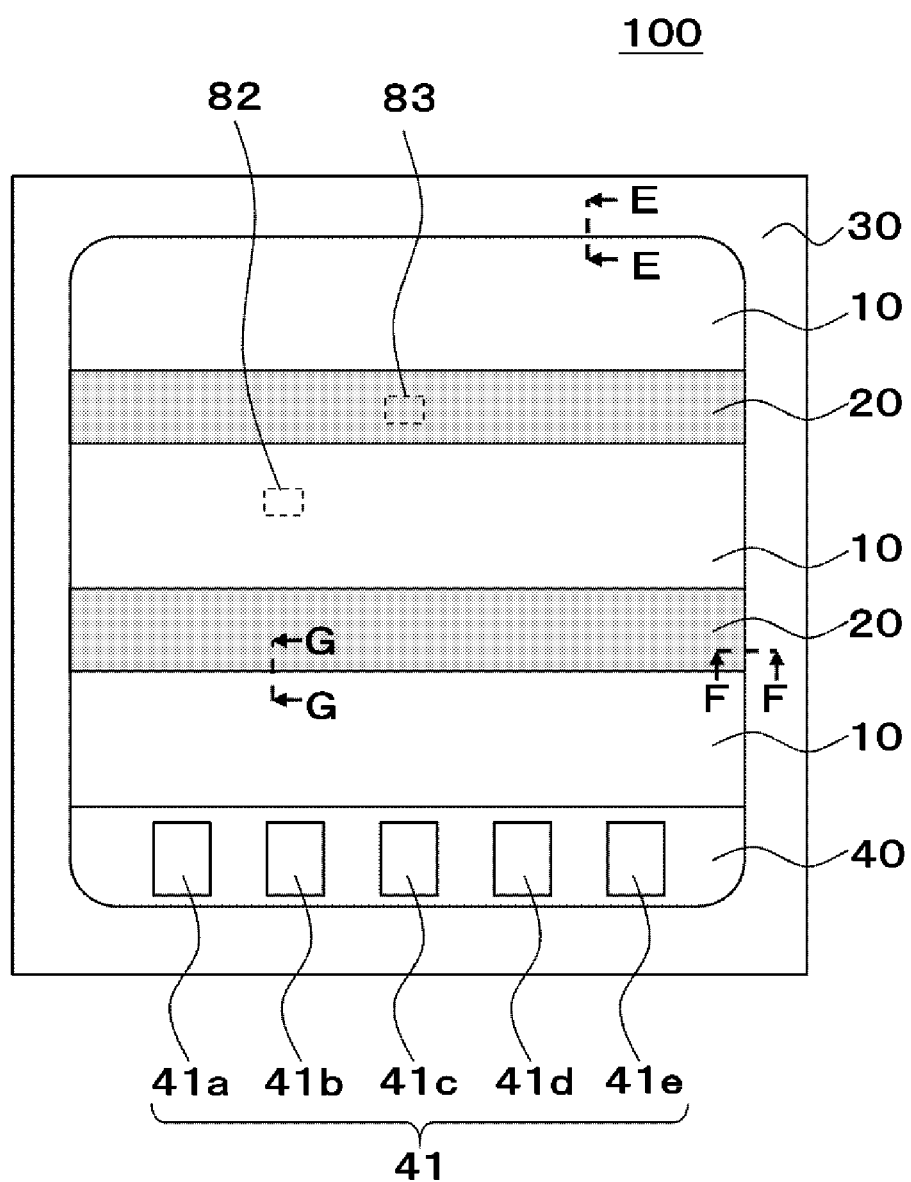
FIG. 1 is a plan view illustrating a semiconductor device of the first embodiment.
Figure 2:
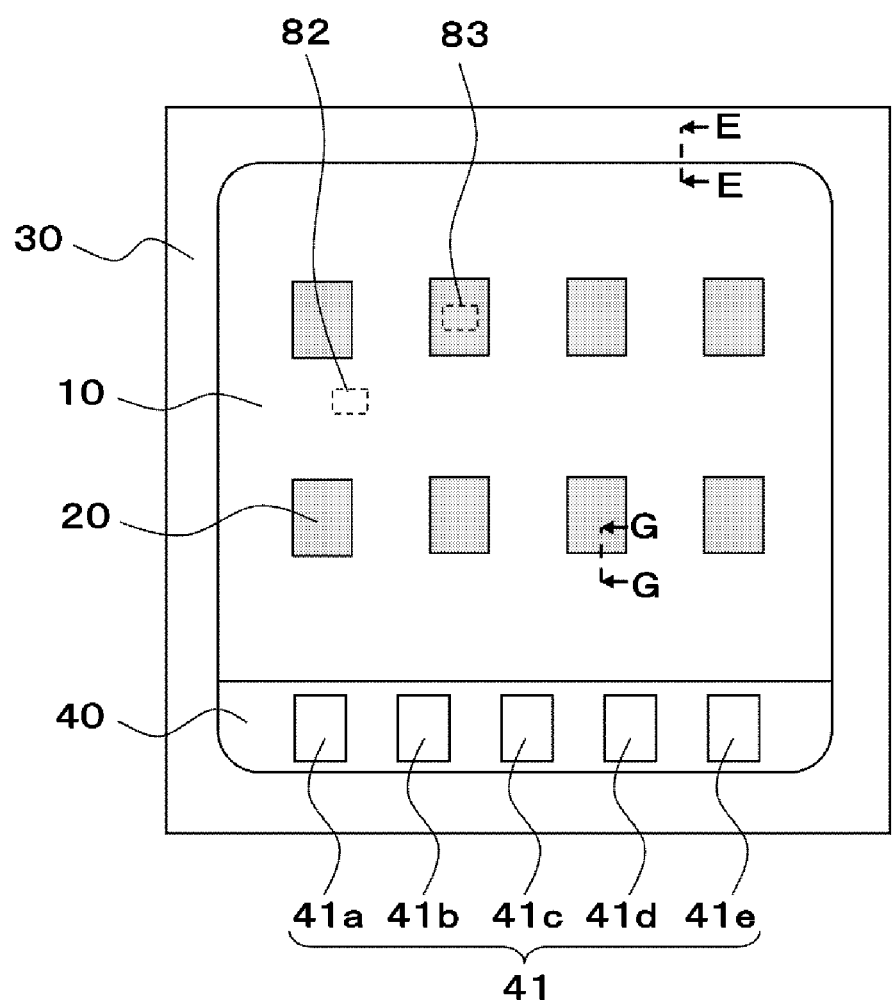
FIG. 2 is a plan view illustrating a semiconductor device of the first embodiment having another configuration.

First, the entire configuration of the semiconductor device of the first embodiment will be described below with reference to FIGS. 1 and 2. FIG. 1 is a plan view illustrating a semiconductor device 100 as an RC-IGBT. FIG. 2 is a plan view illustrating a semiconductor device 101 as an RC-IGBT having another configuration.

The semiconductor device 100 illustrated in FIG. 1 includes an IGBT region 10 and a diode region 20 arranged in stripes, and may be simply referred to as a "stripe type". The semiconductor device 101 illustrated in FIG. 2 includes a plurality of diode regions 20 provided in the longitudinal direction and the lateral direction and an IGBT region 10 provided around the diode regions 20, and may be simply referred to as an "island type".

In FIG. 1, one semiconductor device 100 includes an IGBT region 10 and a diode region 20. The IGBT region 10 and the diode region 20 extend from one end side to the other end side of the semiconductor device 100 and are alternately provided in stripes in a direction orthogonal to a direction in which the IGBT region 10 and the diode region 20 extend. Although FIG. 1 illustrates three IGBT regions 10 and two diode regions 20 in a configuration in which each diode region 20 is sandwiched between the corresponding pair of IGBT regions 10, the number of IGBT regions 10 and the number of diode regions 20 are not limited thereto. The number of IGBT regions 10 may be equal to or larger than three or may be equal to or smaller than three, and the number of diode regions 20 may be equal to or larger than two or may be equal to or smaller than two. The positions of the IGBT regions 10 and the diode regions 20 in FIG. 1 may be interchanged so that each IGBT region 10 is sandwiched between the corresponding pair of diode regions 20. Alternatively, only one IGBT region 10 and one diode region 20 may be provided side by side.

As illustrated in FIG. 1, a pad region 40 is provided adjacent to an IGBT region 10 at a lower part of the sheet. The pad region 40 includes a control pad 41 for controlling the semiconductor device 100. The IGBT regions 10 and the diode regions 20 are collectively referred to as a cell region. A terminal region 30 for maintaining the withstand voltage of the semiconductor device 100 is provided around an integration of the cell region and the pad region 40. The terminal region 30 may selectively have a well-known withstand voltage maintaining structure as appropriate. In the withstand voltage maintaining structure, for example, a field limiting ring (FLR) in which the cell region is surrounded by a p-type terminal well layer of a p-type semiconductor or a variation of lateral doping (VLD) in which the cell region is surrounded by a p-type well layer having a concentration gradient may be provided on a first principal surface side that is a front surface side of the semiconductor device 100. The number of ring-shaped p-type terminal well layers used in the FLR and concentration distribution used in the VLD may be selected as appropriate, depending on designing of the withstand voltage of the semiconductor device 100. In addition, a p-type terminal well layer may be provided across a substantially entire range of the pad region 40, and an IGBT cell or a diode cell may be provided in the pad region 40.

The control pads 41 may be, for example, a current sense pad 41a, a Kelvin emitter pad 41b, a gate pad 41c, and temperature sense diode pads 41d and 41e. The current sense pad 41a is a control pad for sensing current flowing to the cell region of the semiconductor device 100 and electrically connected with an IGBT cell or a diode cell as part of the cell region so that when current flows to the cell region of the semiconductor device 100, current several times to several ten thousand times smaller than the current flowing to the entire cell region flows.

The Kelvin emitter pad 41b and the gate pad 41c are control pads to which gate drive voltage for on-off control of the semiconductor device 100 is applied. The Kelvin emitter pad 41b is electrically connected with a p-type base layer of the IGBT cell, and the gate pad 41c is electrically connected with a gate trench electrode of the IGBT cell. The Kelvin emitter pad 41b and the p-type base layer may be electrically connected with each other through a p-type contact layer. The temperature sense diode pads 41d and 41e are control pads electrically connected with the anode and cathode of a temperature sense diode provided in the semiconductor device 100. The temperature sense diode pads 41d and 41e measure voltage between the anode and cathode of the temperature sense diode (not illustrated) provided in the cell region, thereby measuring the temperature of the semiconductor device 100.

In FIG. 2, one semiconductor device 101 includes an IGBT region 10 and a diode region 20. A plurality of diode regions 20 are arranged in each of the longitudinal direction and the lateral direction in the semiconductor device, and each diode region 20 is surrounded by the IGBT region 10. In other words, the plurality of diode regions 20 are provided as islands in the IGBT region 10. Although FIG. 2 illustrates a configuration in which the diode regions 20 are arranged in a matrix of four columns in the right-left direction of the sheet and two rows in the up-down direction of the sheet, the number and arrangement of diode regions 20 are not limited thereto. One or a plurality of diode regions 20 may be scattered in the IGBT region 10 so that each diode region 20 is surrounded by the IGBT region 10.

As illustrated in FIG. 2, a pad region 40 is provided adjacent to the IGBT region 10 at a lower part of the sheet. A terminal region 30 for maintaining the withstand voltage of the semiconductor device 101 is provided around an integration of the pad region 40 and a cell region including the IGBT region 10 and the diode regions 20. The structures of the pad region 40 and the terminal region 30 may be same as those of the semiconductor device 100 illustrated in FIG. 1.

Figure 3:
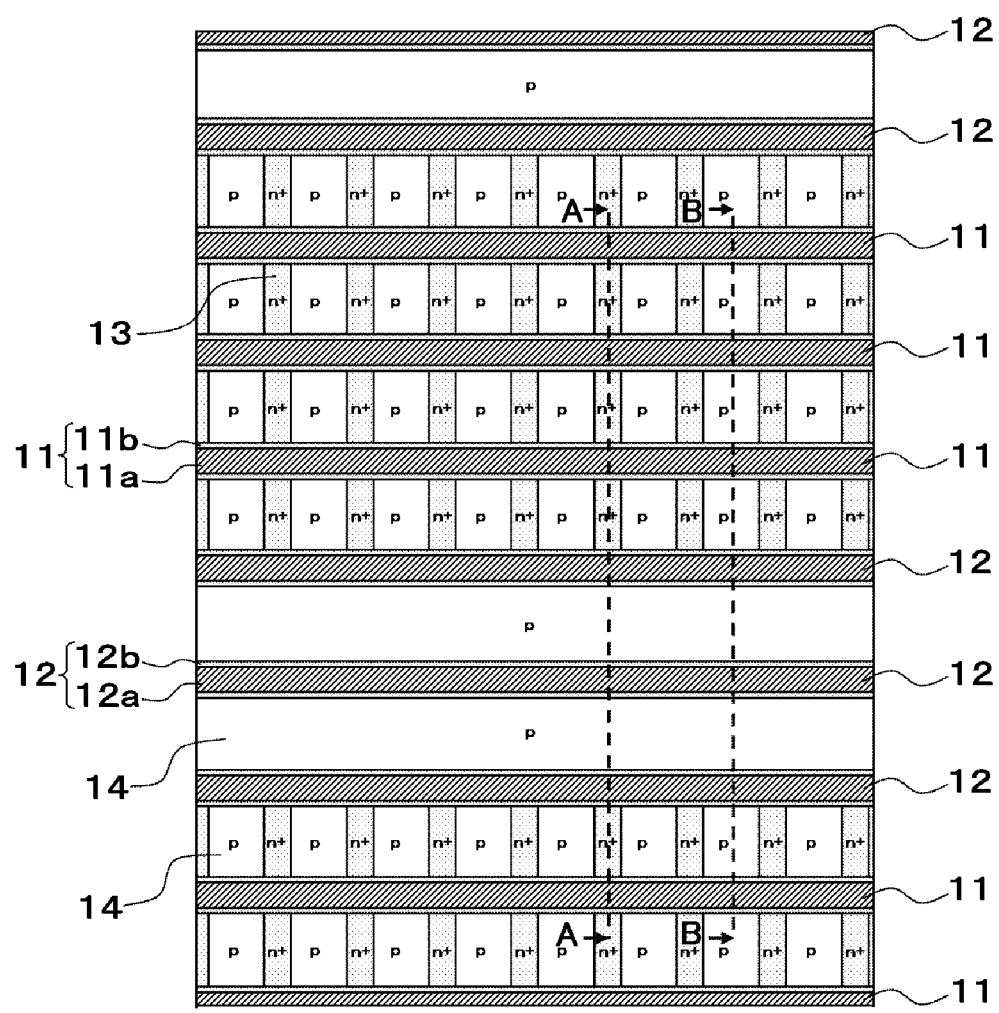
FIG. 3 is a partially enlarged plan view illustrating the configuration of the IGBT region of the semiconductor device of the first embodiment.
Figure 4:
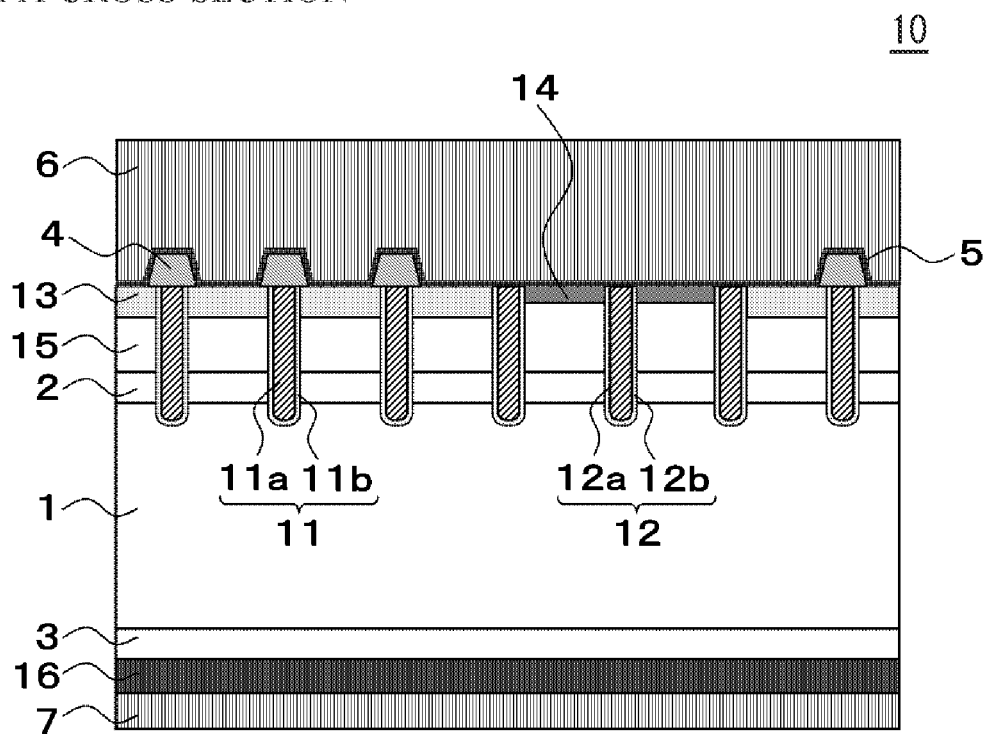
FIG. 4 is a A-A cross-sectional view illustrating the configuration of the IGBT region of the semiconductor device of the first embodiment.
Figure 5:
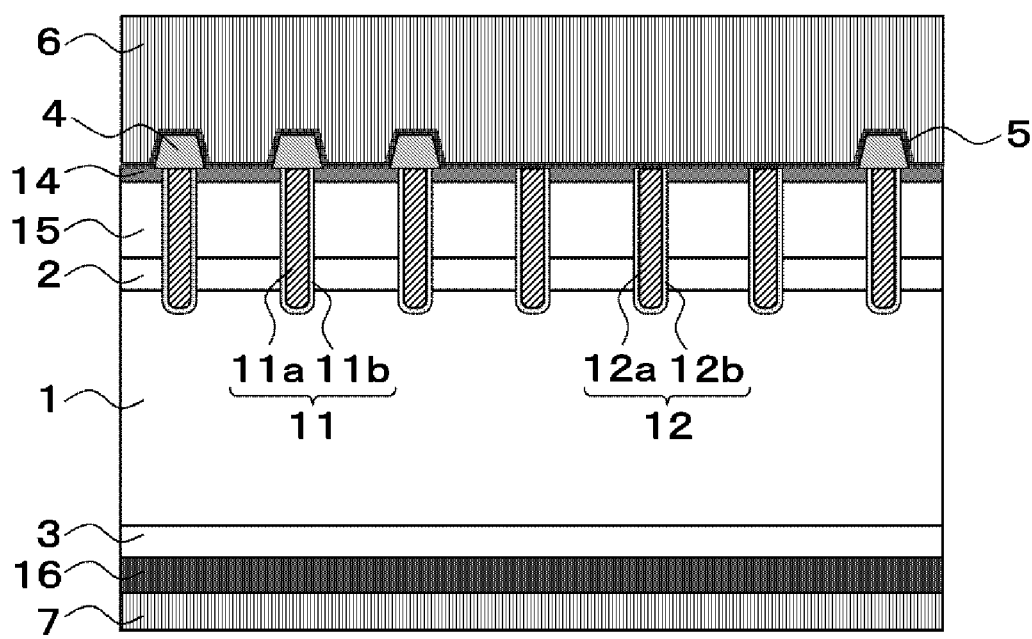
FIG. 5 is a B-B cross-sectional view illustrating the configuration of the IGBT region of the semiconductor device of the first embodiment.

Subsequently, the configuration of the IGBT region of the semiconductor device of the first embodiment will be described below in detail with reference to FIGS. 3 to 5. FIG. 3 is a partially enlarged plan view illustrating the configuration of the IGBT region of the semiconductor device as an RC-IGBT. FIGS. 4 and 5 are cross-sectional views illustrating the configuration of the IGBT region of the semiconductor device as an RC-IGBT. FIG. 3 is an enlarged view of a region surrounded by a dashed line 82 in the semiconductor device 100 illustrated in FIG. 1 or the semiconductor device 101 illustrated in FIG. 2. FIG. 4 is a cross-sectional view of the semiconductor device 100 or the semiconductor device 101 illustrated in FIG. 3, which is taken along a dashed line A-A. FIG. 5 is a cross-sectional view of the semiconductor device 100 or the semiconductor device 101 illustrated in FIG. 3, which is taken along a dashed line B-B.

As illustrated in FIG. 3, the IGBT region 10 includes an active trench gate 11 and a dummy trench gate 12 arranged in stripes. In the semiconductor device 100, the active trench gate 11 and the dummy trench gate 12 extend in the longitudinal direction of the IGBT region 10 and have longitudinal directions aligned with the longitudinal direction of the IGBT region 10. In the semiconductor device 101, the longitudinal and transverse directions of the IGBT region 10 are not particularly distinguished, but the longitudinal directions of the active trench gate 11 and the dummy trench gate 12 may be aligned with the right-left direction of the sheet or the up-down direction of the sheet.

The active trench gate 11 has a configuration in which a gate trench electrode 11a is provided in a trench formed in the semiconductor substrate through a gate trench insulating film 11b. The dummy trench gate 12 has a configuration in which a dummy trench electrode 12a is provided in a trench formed in the semiconductor substrate through a dummy trench insulating film 12b. The gate trench electrode 11a of the active trench gate 11 is electrically connected with the gate pad 41c. The dummy trench electrode 12a of the dummy trench gate 12 is electrically connected with an emitter electrode provided on the first principal surface of the semiconductor device 100 or the semiconductor device 101.

$n^+$-type source layers 13 are provided in contact with the gate trench insulating film 11b on both sides in the width direction of the active trench gate 11. Each $n^+$-type source layer 13 is a semiconductor layer containing, for example, arsenic or phosphorus as n-type impurities, and the concentration of the n-type impurities is $1.0E+17/cm^3$ to $1.0E+20/cm^3$. The $n^+$-type source layers 13 are alternately provided with p-type contact layers 14 in a direction in which the active trench gate 11 extends. Another p-type contact layer 14 is provided between each pair of adjacent dummy trench gates 12. Each p-type contact layer 14 is a semiconductor layer containing aluminum as p-type impurities, and the concentration of aluminum as the p-type impurities is preferably $1.0E+12/cm^3$ to $1.0E+18/cm^3$.

As illustrated in FIG. 3, in the IGBT region 10 of the semiconductor device 100 or the semiconductor device 101, three dummy trench gates 12 are arranged adjacent to three active trench gates 11, and another three active trench gates 11 are arranged adjacent to the three dummy trench gates 12. The IGBT region 10 has such a configuration in which the set of active trench gates 11 and the set of dummy trench gates 12 are alternately arranged. The number of active trench gates 11 included in one set of active trench gates 11 is three in FIG. 3, but may be equal to or larger than one. The number of dummy trench gates 12 included in one set of dummy trench gates 12 may be equal to or larger than one, or the number of dummy trench gates 12 may be zero. In other words, all trenches provided in the IGBT region 10 may be active trench gates 11.

FIG. 4 is a cross-sectional view of the semiconductor device 100 or the semiconductor device 101, which is taken along the dashed line A-A in FIG. 3, and is a cross-sectional view of the IGBT region 10. The semiconductor device 100 or the semiconductor device 101 includes an $n^-$-type drift layer 1 made of the semiconductor substrate. The $n^-$-type drift layer 1 is a semiconductor layer containing, for example, arsenic or phosphorus as n-type impurities, and the concentration of the n-type impurities is $1.0E+12/cm^3$ to $1.0E+15/cm^3$, which is lower than the p-type impurity concentration of the p-type contact layer 14. The semiconductor substrate ranges from the $n^+$-type source layer 13 and the p-type contact layer 14 to a p-type collector layer 16 in FIG. 4. In FIG. 4, upper ends of the $n^+$-type source layer 13 and the p-type contact layer 14 in the sheet are referred to as the first principal surface of the semiconductor substrate, and a lower end of the p-type collector layer 16 in the sheet is referred to as a second principal surface of the semiconductor substrate. The first principal surface of the semiconductor substrate is a principal surface of the semiconductor device 100 on the front surface side, and the second principal surface of the semiconductor substrate is a principal surface of the semiconductor device 100 on a back surface side. The semiconductor device 100 includes the $n^-$-type drift layer 1 between the first principal surface and the second principal surface opposite to the first principal surface in the IGBT region 10 of the cell region.

As illustrated in FIG. 4, in the IGBT region 10, an n-type carrier accumulation layer 2 having n-type impurity concentration higher than that of the $n^-$-type drift layer 1 is provided on the first principal surface side of the $n^-$-type drift layer 1. The n-type carrier accumulation layer 2 is a semiconductor layer containing, for example, arsenic or phosphorus as n-type impurities, and the concentration of the n-type impurities is $1.0E+13/cm^3$ to $1.0E+17/cm^3$. The semiconductor device 100 or the semiconductor device 101 may have a configuration in which no n-type carrier accumulation layer 2 is provided and the $n^-$-type drift layer 1 is also provided in the region of the n-type carrier accumulation layer 2 illustrated in FIG. 4. With the n-type carrier accumulation layer 2, it is possible to reduce an energization loss when current flows in the IGBT region 10. The n-type carrier accumulation layer 2 and the $n^-$-type drift layer 1 may be collectively referred to as a drift layer.

The n-type carrier accumulation layer 2 is formed by performing ion injection of n-type impurities into the semiconductor substrate as the $n^-$-type drift layer 1 and thereafter diffusing the injected n-type impurities in the semiconductor substrate as the $n^-$-type drift layer 1 by annealing.

A p-type base layer 15 is provided on the first principal surface side of the n-type carrier accumulation layer 2. The p-type base layer 15 is a semiconductor layer containing, for example, boron or aluminum as p-type impurities, and the concentration of the p-type impurities is $1.0E+12/cm^3$ to $1.0E+18/cm^3$. The p-type base layer 15 is in contact with the gate trench insulating film 11b of the active trench gate 11. Each $n^+$-type source layer 13 is provided in contact with the gate trench insulating film 11b of the corresponding active trench gate 11 on the first principal surface side of the p-type base layer 15, and the p-type contact layers 14 are provided in the remaining region. The $n^+$-type source layers 13 and the p-type contact layers 14 serve as the first principal surface of the semiconductor substrate. Each p-type contact layer 14 is a region having p-type impurity concentration higher than that of the p-type base layer 15. The p-type contact layer 14 and the p-type base layer 15 may be individually referred to when needed to be distinguished from each other, or the p-type contact layer 14 and the p-type base layer 15 may be collectively referred to as a p-type base layer.

As illustrated in FIGS. 3 and 4, the p-type contact layer 14 is a semiconductor layer formed on a surface layer between trenches and containing aluminum as p-type impurities. The p-type contact layer 14, which contains aluminum as p-type impurities, can be formed to have a thickness smaller that of the $n^+$-type source layer 13 and is preferably has a thickness equal to or smaller than ½ of the thickness of the $n^+$-type source layer 13. The impurity concentration of aluminum in the p-type contact layer 14 is preferably $1.0E+12/cm^3$ to $1.0E+18/cm^3$. The aluminum may be doped by injecting aluminum ions from the first principal surface side or using electrolytic solution containing aluminum. The p-type contact layer 14 may be formed on at least part of the surface layer between trenches.

In the semiconductor device 100 or the semiconductor device 101, an n-type buffer layer 3 having n-type impurity concentration higher than that of the $n^-$-type drift layer 1 is provided on the second principal surface side of the $n^-$-type drift layer 1. The n-type buffer layer 3 is provided to prevent punch-through of a depleted layer extending to the second principal surface side from the p-type base layer 15 when the semiconductor device 100 is off. The n-type buffer layer 3 may be formed, for example, by injecting phosphorus (P) or proton (H+) or injecting both of phosphorus (P) and proton (H+). The n-type impurity concentration of the n-type buffer layer 3 is $1.0E+12/cm^3$ to $1.0E+18/cm^3$.

The semiconductor device 100 or the semiconductor device 101 may have a configuration in which no n-type buffer layer 3 is provided and the $n^-$-type drift layer 1 is also provided in the region of the n-type buffer layer 3 illustrated in FIG. 4. The n-type buffer layer 3 and the $n^-$-type drift layer 1 may be collectively referred to as a drift layer.

In the semiconductor device 100 or the semiconductor device 101, the p-type collector layer 16 is provided on the second principal surface side of the n-type buffer layer 3. Specifically, the p-type collector layer 16 is provided between the $n^-$-type drift layer 1 and the second principal surface. The p-type collector layer 16 is a semiconductor layer containing, for example, boron or aluminum as p-type impurities, and the concentration of the p-type impurities is $1.0E+16/cm^3$ to $1.0E+20/cm^3$. The p-type collector layer 16 serves as the second principal surface of the semiconductor substrate. The p-type collector layer 16 is provided not only in the IGBT region 10 but also in the terminal region 30, and part of the p-type collector layer 16, which is provided in the terminal region 30 serves as a p-type terminal collector layer 16a. The p-type collector layer 16 may partially protrude from the IGBT region 10 into the diode region 20.

As illustrated in FIG. 4, the semiconductor device 100 or the semiconductor device 101 includes a trench formed from the first principal surface of the semiconductor substrate to the $n^-$-type drift layer 1 through the p-type base layer 15. The gate trench electrode 11a is provided in such a trench through the gate trench insulating film 11b, thereby forming the active trench gate 11. The gate trench electrode 11a faces the $n^-$-type drift layer 1 through the gate trench insulating film 11b. The dummy trench electrode 12a is provided in another trench through the dummy trench insulating film 12b, thereby forming the dummy trench gate 12. The dummy trench electrode 12a faces the $n^-$-type drift layer 1 through the dummy trench insulating film 12b. The gate trench insulating film 11b of the active trench gate 11 is in contact with the p-type base layer 15 and the $n^+$-type source layer 13. When gate drive voltage is applied to the gate trench electrode 11a, a channel is formed in the p-type base layer 15 in contact with the gate trench insulating film 11b of the active trench gate 11.

As illustrated in FIG. 4, an interlayer insulating film 4 is provided on the gate trench electrode 11a of the active trench gate 11. A barrier metal 5 is formed on the interlayer insulating film 4 and a region in which the interlayer insulating film 4 is not provided on the first principal surface of the semiconductor substrate. The barrier metal 5 is preferably formed of titanium (Ti) or a titanium alloy and may be, for example, a conductive body containing titanium, such as nitridation titanium or TiSi as an alloy of titanium and silicon (Si). As illustrated in FIG. 4, the barrier metal 5 is in ohmic contact with the $n^+$-type source layer 13, the p-type contact layer 14, and the dummy trench electrode 12a and electrically connected with the $n^+$-type source layer 13, the p-type contact layer 14, and the dummy trench electrode 12a.

An emitter electrode 6 is provided on the barrier metal 5. For example, the emitter electrode 6 may be formed of an aluminum alloy such as an aluminum-silicon alloy (Al—Si alloy) or may be an electrode made of a plurality of layered metal films on which a plated film is formed by non-electrolytic plating or electrolytic plating on an electrode formed of an aluminum alloy. The plated film formed by non-electrolytic plating or electrolytic plating may be, for example, a nickel (Ni) plated film or a copper (Cu) plated film. Power cycle immunity improves when the emitter electrode 6 is formed of copper or a copper alloy, which has large mechanical strength, such as a copper plated film. The emitter electrode 6 may further include a gold (Au) plated film on a nickel plated film or a copper plated film.

When there is a minute region such as a region between the interlayer insulating films 4 adjacent to each other, in which favorable embedding cannot be obtained with the emitter electrode 6, tungsten, which has a more favorable embedding property than that of the emitter electrode 6, may be disposed in the minute region, and the emitter electrode 6 may be provided on the tungsten. The barrier metal 5 may be provided only on an n-type semiconductor layer such as the $n^+$-type source layer 13. The barrier metal 5 and the emitter electrode 6 may be collectively referred to as an emitter electrode. Although FIG. 4 illustrates a diagram in which no interlayer insulating film 4 is provided on the dummy trench electrode 12a of the dummy trench gate 12, the interlayer insulating film 4 may be formed on the dummy trench electrode 12a of the dummy trench gate 12. When the interlayer insulating film 4 is formed on the dummy trench electrode 12a of the dummy trench gate 12, the emitter electrode 6 and the dummy trench electrode 12a may be electrically connected with each other at another section.

The following describes the configuration of the semiconductor device according to the present embodiment, which includes the barrier metal 5, but no barrier metal 5 may be provided so that the emitter electrode 6 is provided on the n+-type source layer 13, the p-type contact layer 14, and the dummy trench electrode 12*a*. Titanium contained in the barrier metal has a high energy barrier height for p-type silicon, and thus conventionally, ohmic contact between the barrier metal and the p-type contact layer of p-type silicon has been achieved by setting the impurity concentration of the p-type contact layer to be high. Aluminum contained in the emitter electrode has a lower barrier height for p-type silicon than that of titanium, and thus ohmic contact between the emitter electrode and the p-type contact layer of p-type silicon can be achieved at low p-type impurity concentration.

A collector electrode 7 is provided on the second principal surface side of the p-type collector layer 16. Similarly to the emitter electrode 6, the collector electrode 7 may be made of an aluminum alloy or may be made of an aluminum alloy and a plated film. The collector electrode 7 may have a configuration different from that of the emitter electrode 6. The collector electrode 7 is in ohmic contact with the p-type collector layer 16 and electrically connected with the p-type collector layer 16.

FIG. 5 is a cross-sectional view of the semiconductor device 100 or the semiconductor device 101, which is taken along the dashed line B-B in FIG. 3, and is a cross-sectional view of the IGBT region 10. Difference from the cross-sectional view taken along the dashed line A-A and illustrated in FIG. 4 is that the n+-type source layer 13 provided in contact with the active trench gate 11 on the first principal surface side in the semiconductor substrate is not included in a section taken along the dashed line B-B in FIG. 5. As illustrated in FIG. 3, the n+-type source layer 13 is selectively provided on the first principal surface side of a p-type base layer. This p-type base layer is the p-type base layer as which the p-type base layer 15 and the p-type contact layer 14 are collectively referred to.

Figure 6:
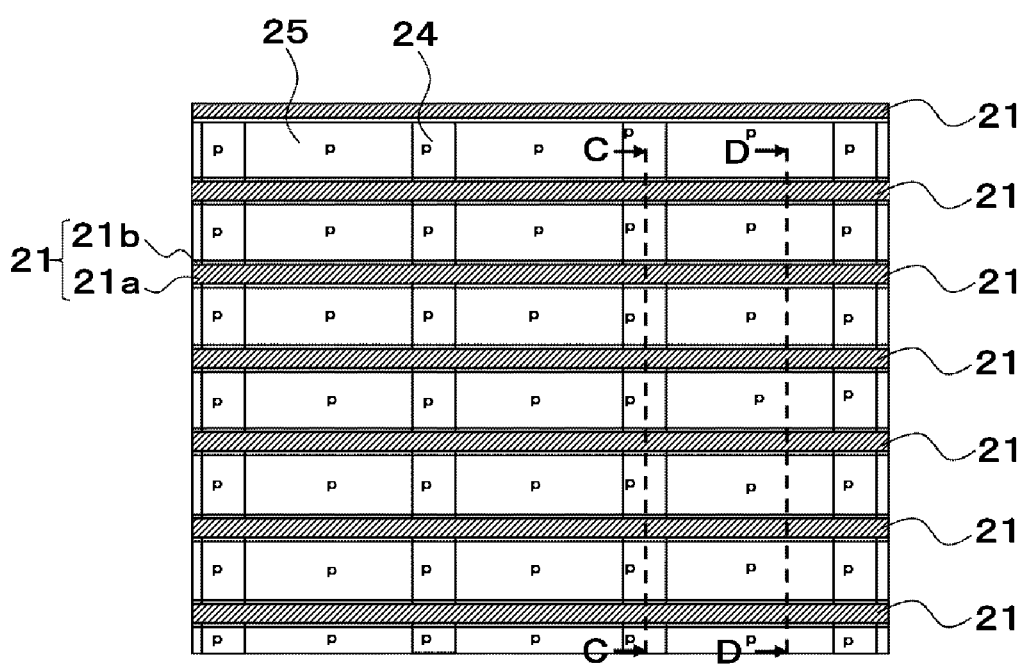
FIG. 6 is a partially enlarged plan view illustrating the configuration of the diode region of the semiconductor device of the first embodiment.
Figure 7:
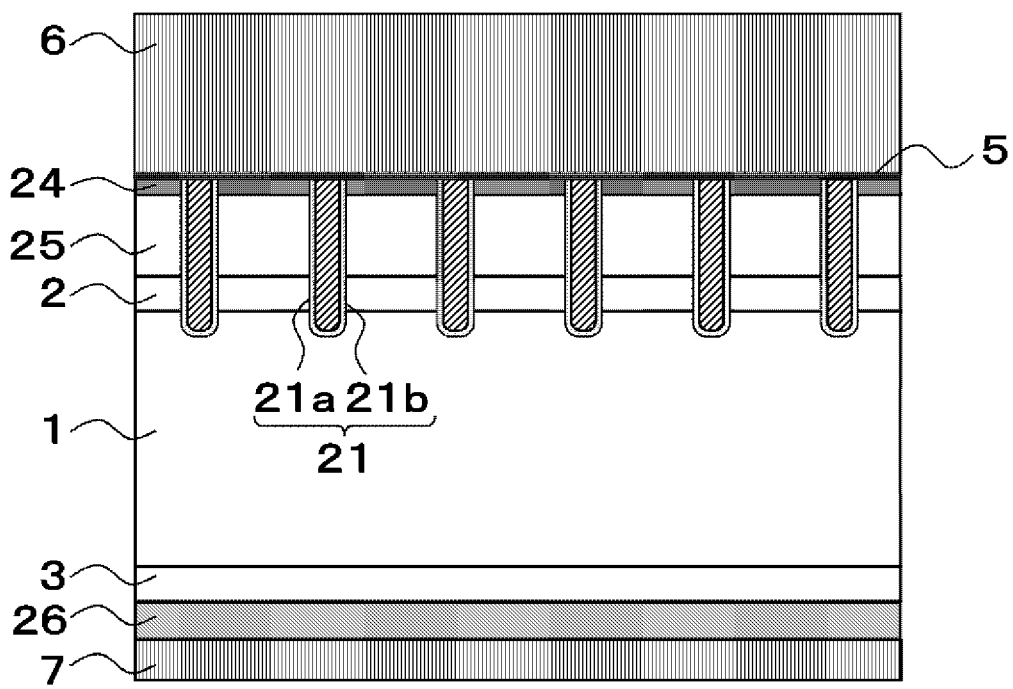
FIG. 7 is a C-C cross-sectional view illustrating the configuration of the diode region of the semiconductor device of the first embodiment.
Figure 8:
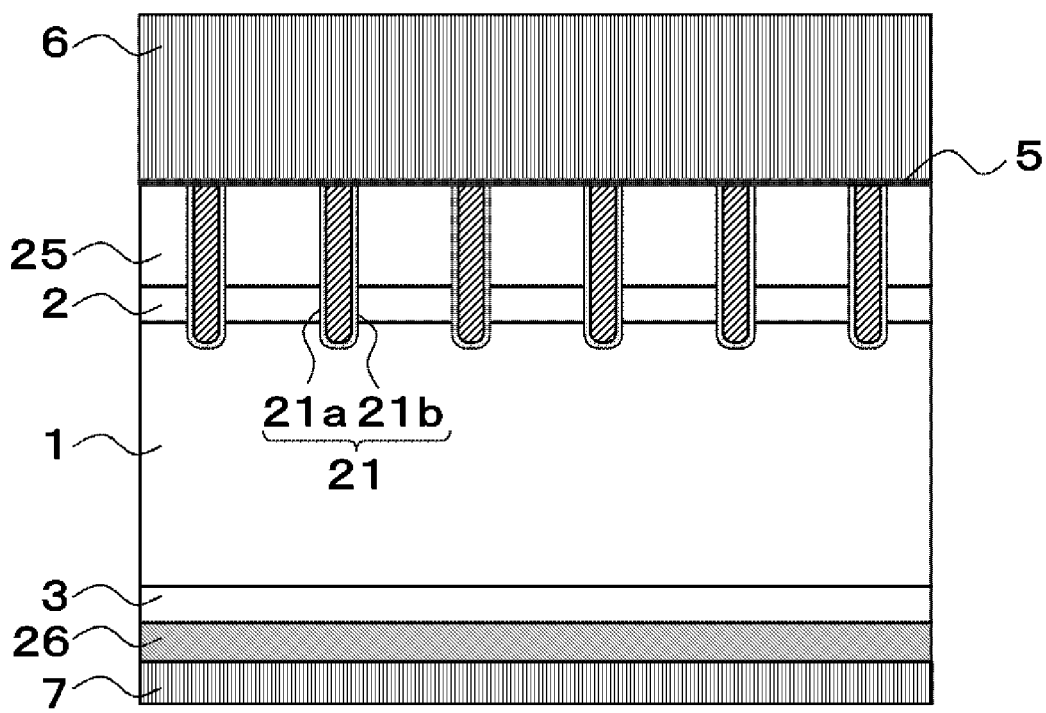
FIG. 8 is a D-D cross-sectional view illustrating the configuration of the diode region of the semiconductor device of the first embodiment.

Subsequently, the configuration of the diode region of the semiconductor device of the first embodiment will be described below in detail with reference to FIGS. 6 to 8. FIG. 6 is a partially enlarged plan view illustrating the configuration of the diode region of the semiconductor device as an RC-IGBT. FIGS. 7 and 8 are cross-sectional views illustrating the configuration of the diode region of the semiconductor device as an RC-IGBT. FIG. 6 is an enlarged view of a region surrounded by a dashed line 83 in the semiconductor device 100 or the semiconductor device 101 illustrated in FIG. 1. FIG. 7 is a cross-sectional view of the semiconductor device 100 illustrated in FIG. 6, which is taken along a dashed line C-C. FIG. 8 is a cross-sectional view of the semiconductor device 100 illustrated in FIG. 6, which is taken along a dashed line D-D.

A diode trench gate 21 extends from one end side toward the opposing other end side of the diode region 20 of the cell region along the first principal surface of the semiconductor device 100 or the semiconductor device 101. The diode trench gate 21 has a configuration in which a diode trench electrode 21*a* is provided through a diode trench insulating film 21*b* in a trench formed in the semiconductor substrate in the diode region 20. The diode trench electrode 21*a* faces the n−-type drift layer 1 through the diode trench insulating film 21*b*. A p-type contact layer 24 and a p-type anode layer 25 are provided between two diode trench gates 21 adjacent to each other. The p-type contact layer 24 is a semiconductor layer containing aluminum as p-type impurities, and the concentration of aluminum as the p-type impurities is preferably 1.0E+12/cm³ to 1.0E+18/cm³. The p-type anode layer 25 is a semiconductor layer containing, for example, boron or aluminum as p-type impurities, and the concentration of the p-type impurities is 1.0E+12/cm³ to 1.0E+18/cm³. The p-type contact layer 24 and the p-type anode layer 25 are alternately provided in the longitudinal direction of the diode trench gate 21.

FIG. 7 is a cross-sectional view of the semiconductor device 100 or the semiconductor device 101, which is taken along the dashed line C-C in FIG. 6, and is a cross-sectional view of the diode region 20. In the semiconductor device 100 or the semiconductor device 101, the diode region 20 includes the n−-type drift layer 1 made of the semiconductor substrate like the IGBT region 10. The n−-type drift layer 1 in the diode region 20 and the n−-type drift layer 1 in the IGBT region 10 are continuously and integrally formed of the identical semiconductor substrate. In FIG. 7, the semiconductor substrate ranges from the p-type contact layer 24 to an n+-type cathode layer 26. In FIG. 7, an upper end of the sheet of the p-type contact layer 24 is referred to as the first principal surface of the semiconductor substrate, and a lower end of the sheet of the n+-type cathode layer 26 is referred to as the second principal surface of the semiconductor substrate. The first principal surface in the diode region 20 is same as the first principal surface in the IGBT region 10, and the second principal surface in the diode region 20 is same as the second principal surface in the IGBT region 10.

As illustrated in FIG. 7, in the diode region 20, similarly to the IGBT region 10, the n-type carrier accumulation layer 2 is provided on the first principal surface side of the n−-type drift layer 1, and the n-type buffer layer 3 is provided on the second principal surface side of the n−-type drift layer 1. The n-type carrier accumulation layer 2 and the n-type buffer layer 3 provided in the diode region 20 have configurations of identical to those of the n-type carrier accumulation layer 2 and the n-type buffer layer 3 provided in the IGBT region 10. The n-type carrier accumulation layer 2 does not necessarily need to be provided in the IGBT region 10 and the diode region 20, and no n-type carrier accumulation layer 2 may be provided in the diode region 20 even when the n-type carrier accumulation layer 2 is provided in the IGBT region 10. Similarly to the case of the IGBT region 10, the n−-type drift layer 1, the n-type carrier accumulation layer 2, and the n-type buffer layer 3 may be collectively referred to as a drift layer.

The p-type anode layer 25 is provided on the first principal surface side of the n-type carrier accumulation layer 2. The p-type anode layer 25 is provided between the n−-type drift layer 1 and the first principal surface. The p-type anode layer 25 may have p-type impurity concentration same as that of the p-type base layer 15 in the IGBT region 10, and the p-type anode layer 25 and the p-type base layer 15 may be simultaneously formed. Alternatively, the p-type impurity concentration of the p-type anode layer 25 may be lower than that of the p-type base layer 15 in the IGBT region 10 to reduce the number of holes injected into the diode region 20 in diode operation. The recovery loss in diode operation can be reduced when the number of holes injected in diode operation is reduced.

The p-type contact layer 24 is provided on the first principal surface side of the p-type anode layer 25. The concentration of aluminum as the p-type impurities of the p-type contact layer 24 may be same as or different from the concentration of aluminum as the p-type impurities of the p-type contact layer 14 in the IGBT region 10. The p-type contact layer 24 serves as the first principal surface of the semiconductor substrate. The p-type contact layer 24 is a region having p-type impurity concentration higher than that of the p-type anode layer 25. The p-type contact layer 24 and the p-type anode layer 25 may be individually referred to when needed to be distinguished from each other, or the p-type contact layer 24 and the p-type anode layer 25 may be collectively referred to as a p-type anode layer.

In the diode region 20, the n$^+$-type cathode layer 26 is provided on the second principal surface side of the n-type buffer layer 3. The n$^+$-type cathode layer 26 is provided between the n$^-$-type drift layer 1 and the second principal surface. The n$^+$-type cathode layer 26 is a semiconductor layer containing, for example, arsenic or phosphorus as n-type impurities, and the concentration of the n-type impurities is $1.0E+16/cm^3$ to $1.0E+21/cm^3$. As illustrated in FIG. 2, the n$^+$-type cathode layer 26 is partially or entirely provided in the diode region 20. The n$^+$-type cathode layer 26 serves as the second principal surface of the semiconductor substrate. Although not illustrated, additional p-type impurities may be selectively injected into a region in which the n$^+$-type cathode layer 26 is formed as described above, thereby providing a p-type cathode layer as a p-type semiconductor at part of the region in which the n$^+$-type cathode layer 26 is formed.

As illustrated in FIG. 7, the diode region 20 of the semiconductor device 100 or the semiconductor device 101 includes a trench extending from the first principal surface of the semiconductor substrate to the n$^-$-type drift layer 1 through the p-type anode layer 25 is formed. The diode trench electrode 21a is provided through the diode trench insulating film 21b in the trench in the diode region 20, thereby forming the diode trench gate 21. The diode trench electrode 21a faces the n$^-$-type drift layer 1 through the diode trench insulating film 21b.

As illustrated in FIG. 7, the barrier metal 5 is provided on the diode trench electrode 21a and the p-type contact layer 24. The barrier metal 5 is in ohmic contact with the diode trench electrode 21a and the p-type contact layer 24 and electrically connected with the diode trench electrode 21a and the p-type contact layer 24. The barrier metal 5 may have a configuration identical to that of the barrier metal 5 in the IGBT region 10. The emitter electrode 6 is provided on the barrier metal 5. The emitter electrode 6 provided in the diode region 20 is formed continuously with the emitter electrode 6 provided in the IGBT region 10. Similarly to the case of the IGBT region 10, no barrier metal 5 may be provided so that the diode trench electrode 21a and the p-type contact layer 24 are in ohmic contact with the emitter electrode 6. Although FIG. 7 illustrates a diagram in which no interlayer insulating film 4 is provided on the diode trench electrode 21a of the diode trench gate 21, the interlayer insulating film 4 may be formed on the diode trench electrode 21a of the diode trench gate 21. When the interlayer insulating film 4 is formed on the diode trench electrode 21a of the diode trench gate 21, the emitter electrode 6 and the diode trench electrode 21a may be electrically connecting with each other at another section.

The collector electrode 7 is provided on the second principal surface side of the n$^+$-type cathode layer 26. Similarly to the emitter electrode 6, the collector electrode 7 in the diode region 20 is formed continuously with the collector electrode 7 provided in the IGBT region 10. The collector electrode 7 is in ohmic contact with the n$^+$-type cathode layer 26 and electrically connected with the n$^+$-type cathode layer 26.

FIG. 8 is a cross-sectional view of the semiconductor device 100 or the semiconductor device 101, which is taken along the dashed line D-D in FIG. 6, and is a cross-sectional view of the diode region 20. Difference from the cross-sectional view taken along the dashed line C-C and illustrated in FIG. 7 is that no p-type contact layer 24 is provided between the p-type anode layer 25 and the barrier metal 5 and the p-type anode layer 25 serves as the first principal surface of the semiconductor substrate. Thus, the p-type contact layer 24 illustrated in FIG. 7 is selectively provided on the first principal surface side of the p-type anode layer 25.

Figure 9:
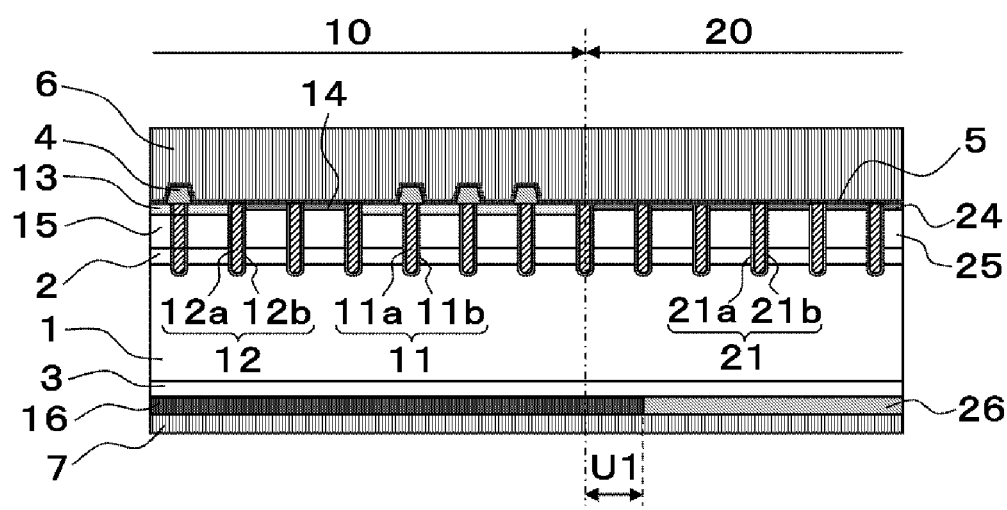
FIG. 9 is a G-G cross-sectional view illustrating the configuration of a boundary between the IGBT region and the diode region in the semiconductor device of the first embodiment.

The following describes, with reference to FIG. 9, a boundary region between the IGBT region and the diode region in the semiconductor device of the first embodiment. FIG. 9 is a cross-sectional view illustrating the configuration of a boundary between the IGBT region and the diode region in the semiconductor device as an RC-IGBT. FIG. 9 is a cross-sectional view taken along a dashed line G-G in the semiconductor device 100 or the semiconductor device 101 illustrated in FIG. 1. FIG. 9 is a cross-sectional view at a site having a section in which the n$^+$-type source layer 13 is included as illustrated with the dashed line A-A in FIG. 3.

As illustrated in FIG. 9, the p-type collector layer 16 provided on the second principal surface side in the IGBT region 10 protrudes on the diode region 20 side from the boundary between the IGBT region 10 and the diode region 20 by a distance U1. When the p-type collector layer 16 protrudes in the diode region 20 in this manner, the distance between the n$^+$-type cathode layer 26 and the active trench gate 11 in the diode region 20 increases to prevent current flow to the n$^+$-type cathode layer 26 through a channel formed adjacent to the active trench gate 11 in the IGBT region 10 when gate drive voltage is applied to the gate trench electrode 11a in freewheeling diode operation. The distance U1 may be, for example, 100 μm. The distance U1 may be zero or smaller than 100 μm, depending on usage of the semiconductor device 100 or the semiconductor device 101 as an RC-IGBT.

As illustrated in FIG. 9, the p-type contact layer 24 is formed on the surface layer between trenches and is a semiconductor layer containing aluminum as p-type impurities. The p-type contact layer 24, which contains aluminum as p-type impurities, can be formed to have a thickness smaller than that of the n$^+$-type source layer 13 and preferably has a thickness equal to ½ of the thickness of the n$^+$-type source layer 13. The aluminum may be doped by injecting aluminum ions from the first principal surface side or using electrolytic solution containing aluminum. The p-type contact layer 24 may be formed on at least part of the surface layer between trenches.

Figure 10A:
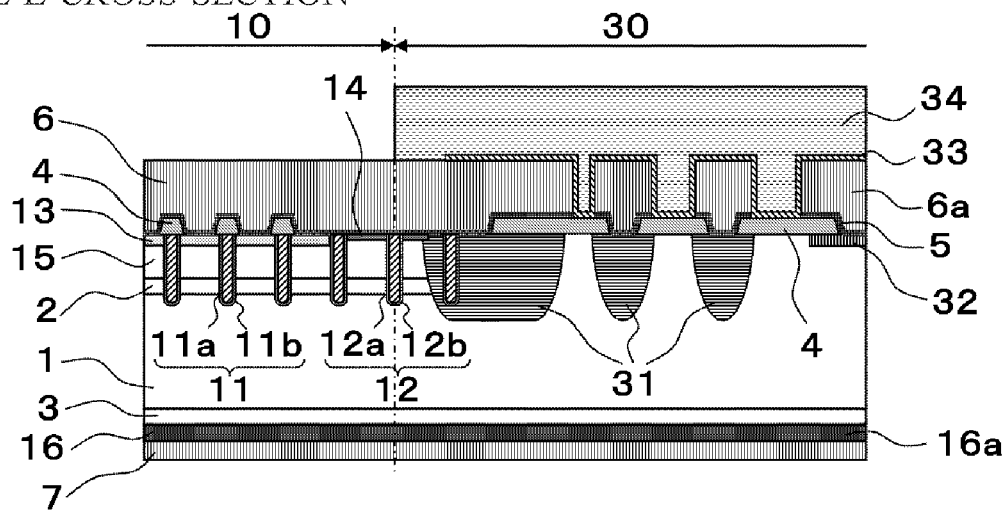
FIG. 10A and FIG. 10B are cross-sectional views illustrating the configuration of the terminal region in the semiconductor device of the first embodiment.
Figure 10B:
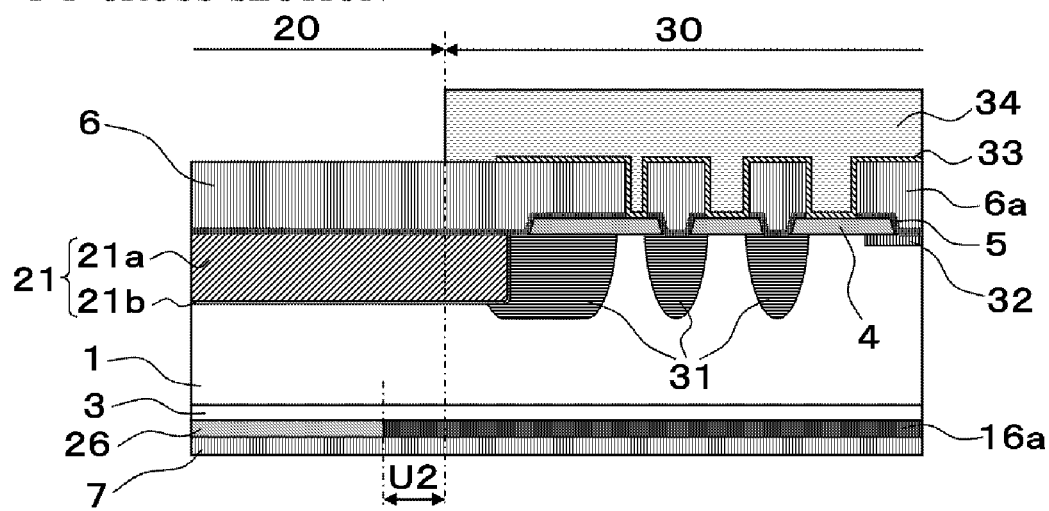

The configuration of the terminal region of the semiconductor device of the first embodiment will be described below with reference to FIG. 10. FIG. 10 are cross-sectional views illustrating the configuration of the terminal region of the semiconductor device as an RC-IGBT. FIG. 10A is a cross-sectional view taken along a dashed line E-E in FIG. 1 or FIG. 2 and ranging from the IGBT region 10 to the terminal region 30. FIG. 10B is a cross-sectional view taken along a dashed line F-F in FIG. 1 and ranging from the diode region 20 to the terminal region 30.

As illustrated in FIGS. 10A and 10B, the terminal region 30 of the semiconductor device 100 includes the n$^-$-type drift layer 1 between the first and second principal surfaces of the semiconductor substrate. The first and second principal surfaces in the terminal region 30 are same as the first and second principal surfaces in each of the IGBT region 10 and the diode region 20, respectively. The n$^-$-type drift layer 1 in the terminal region 30 has a configuration identical to that of the n⁻-type drift layer 1 in each of the IGBT region 10 and the diode region 20 and is continuously and integrally formed through the regions.

A p-type terminal well layer 31 is provided on the first principal surface side of the n⁻-type drift layer 1, in other words, between the first principal surface of the semiconductor substrate and the n⁻-type drift layer 1. The p-type terminal well layer 31 is a semiconductor layer containing, for example, boron or aluminum as p-type impurities, and the concentration of the p-type impurities is $1.0E+14/cm^3$ to $1.0E+19/cm^3$. The p-type terminal well layer 31 surrounds the cell region including the IGBT region 10 and the diode region 20. A plurality of p-type terminal well layers 31 are provided in ring shapes, and the number of provided p-type terminal well layers 31 is selected as appropriate, depending on designing of the withstand voltage of the semiconductor device 100 or the semiconductor device 101. In addition, a n⁺-type channel stopper layer 32 is provided on an outer edge side of the p-type terminal well layer 31, surrounding the p-type terminal well layer 31.

The p-type terminal collector layer 16a is provided between the n⁻-type drift layer 1 and the second principal surface of the semiconductor substrate. The p-type terminal collector layer 16a is formed continuously and integrally with the p-type collector layer 16 provided in the cell region. Thus, the p-type collector layer 16 may include the p-type terminal collector layer 16a. When the diode region 20 is provided adjacent to the terminal region 30 as in the semiconductor device 100 illustrated in FIG. 1, an end part of the p-type terminal collector layer 16a on the diode region 20 side protrudes in the diode region 20 by a distance U2 as illustrated in FIG. 10B. When the p-type terminal collector layer 16a protrudes in the diode region 20 in this manner, the distance between the n⁺-type cathode layer 26 in the diode region 20 and the p-type terminal well layer 31 increases to prevent the p-type terminal well layer 31 from operating as the anode of a diode. The distance U2 may be, for example, 100 μm.

The collector electrode 7 is provided on the second principal surface of the semiconductor substrate. The collector electrode 7 is continuously and integrally formed from the cell region including the IGBT region 10 and the diode region 20 to the terminal region 30. The emitter electrode 6 continuous from the cell region, and a terminal electrode 6a separated from the emitter electrode 6 are provided on the first principal surface of the semiconductor substrate in the terminal region 30.

The emitter electrode 6 and the terminal electrode 6a are electrically connected with each other through a semi-insulating film 33. The semi-insulating film 33 may be made of, for example, semi-insulating silicon nitride (sinSiN). Each terminal electrode 6a and the p-type terminal well layer 31 or the n⁺-type channel stopper layer 32 are electrically connected with each other through a contact hole formed at the interlayer insulating film 4 provided on the first principal surface in the terminal region 30. In addition, a terminal protective film 34 is provided in the terminal region 30, covering the emitter electrode 6, the terminal electrode 6a, and the semi-insulating film 33. The terminal protective film 34 may be made with, for example, polyimide.

Subsequently, a method of manufacturing the semiconductor device of the first embodiment will be described below with reference to FIGS. 11 to 16. FIGS. 11 to 16 are diagrams illustrating the method of manufacturing the semiconductor device as an RC-IGBT. FIGS. 11 to 14 are diagrams illustrating a process of forming the front surface side of the semiconductor device 100 or the semiconductor device 101, and FIGS. 15 and 16 are diagrams illustrating a process of forming the back surface side of the semiconductor device 100 or the semiconductor device 101.

Figure 11A:
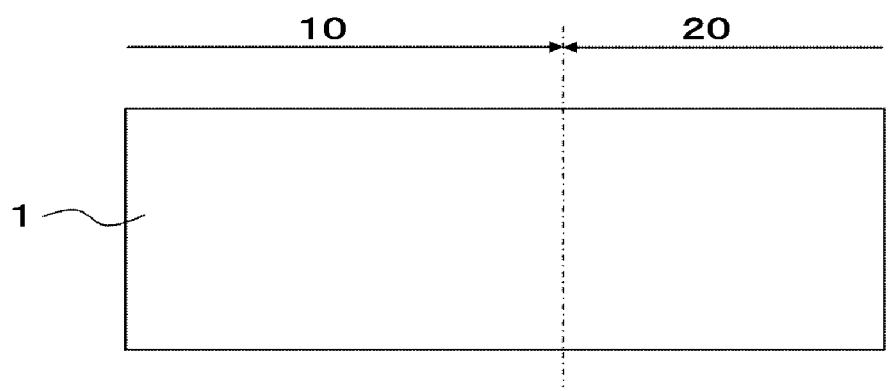
FIG. 11A and FIG. 11B are the first diagrams illustrating the method of manufacturing the semiconductor device of the first embodiment.

First, the semiconductor substrate as the n⁻-type drift layer 1 is prepared as illustrated in FIG. 11A. The semiconductor substrate may be, for example, what is called a floating zone (FZ) wafer produced by a FZ method or what is called a magnetic-field applied Czochralski (MCZ) wafer produced by a MCZ method, and may be an n-type wafer containing n-type impurities. The concentration of n-type impurities contained in the semiconductor substrate is selected as appropriate, depending on the withstand voltage of a semiconductor device to be produced. For a semiconductor device having a withstand voltage of 1200 V, for example, the n-type impurity concentration is adjusted so that the n⁻-type drift layer 1 as the semiconductor substrate has a specific resistance of 40 to 120 Ω·cm approximately. As illustrated in FIG. 11A, the entire semiconductor substrate is the n⁻-type drift layer 1 in the process of preparing the semiconductor substrate. Then, p-type or n-type impurity ions are injected from the first principal surface side or the second principal surface side in the semiconductor substrate and thereafter diffused in the semiconductor substrate through thermal treatment and the like, thereby forming a p-type or n-type semiconductor layer. Accordingly, the semiconductor device 100 or the semiconductor device 101 is manufactured.

As illustrated in FIG. 11A, the semiconductor substrate as the n⁻-type drift layer 1 includes regions to be formed as the IGBT region 10 and the diode region 20. Although not illustrated, the semiconductor substrate also includes a region to be formed as the terminal region 30 around the regions to be formed as the IGBT region 10 and the diode region 20. The following description will be mainly made on a method of manufacturing the configurations of the IGBT region 10 and the diode region 20 of the semiconductor device 100 or the semiconductor device 101, but the terminal region 30 of the semiconductor device 100 or the semiconductor device 101 may be produced by a well-known manufacturing method. For example, when an FLR including a p-type terminal well layer 51 as a withstand voltage maintaining structure is to be formed in the terminal region 30, the FLR may be formed by injecting p-type impurity ions before fabricating the IGBT region 10 and the diode region 20 of the semiconductor device 100 or the semiconductor device 101 or may be formed by injecting p-type impurity ions simultaneously with ion injection of p-type impurities into the IGBT region 10 or the diode region 20 of the semiconductor device 100.

Figure 11B:
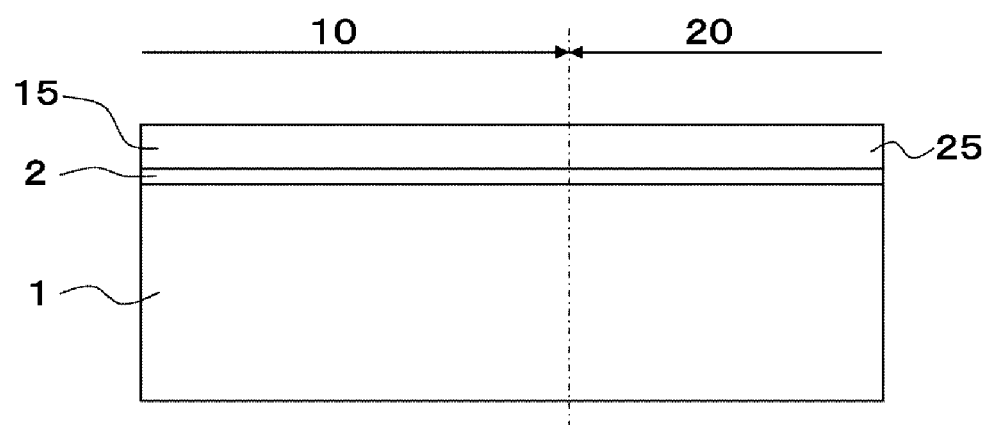

Subsequently, as illustrated in FIG. 11B, the n-type carrier accumulation layer 2 is formed by injecting n-type impurities such as phosphorus (P) from the first principal surface side in the semiconductor substrate. In addition, the p-type base layer 15 and the p-type anode layer 25 are formed by injecting p-type impurities such as boron (B) from the first principal surface side in the semiconductor substrate. The n-type carrier accumulation layer 2, the p-type base layer 15, and the p-type anode layer 25 are formed by injecting impurity ions into the semiconductor substrate and then diffusing the impurity ions through thermal treatment. The layers are selectively formed on the first principal surface side in the semiconductor substrate since n-type and p-type impurity ions are injected after mask processing is provided on the first principal surface of the semiconductor substrate. The n-type carrier accumulation layer 2, the p-type base layer 15, and the p-type anode layer 25 are formed in the IGBT region 10 and the diode region 20 and connected with the p-type terminal well layer 51 in the terminal region 30. The mask processing is processing of forming a mask on the semiconductor substrate to apply resist on the semiconductor substrate, form an opening in a predetermined region of the resist by using a photoengraving technology, and provide ion injection and etching in a predetermined region of the semiconductor substrate through the opening.

The p-type base layer 15 and the p-type anode layer 25 may be formed through simultaneous ion injection of p-type impurities. In this case, the p-type base layer 15 and the p-type anode layer 25 have the same depth and the same p-type impurity concentration and have configurations identical to each other. Alternatively, the depth and the p-type impurity concentration may be made different between the p-type base layer 15 and the p-type anode layer 25 by separately performing ion injection of p-type impurities into the p-type base layer 15 and the p-type anode layer 25 through mask processing.

The p-type terminal well layer 51 may be formed at another section with the p-type anode layer 25 through simultaneous ion injection of p-type impurities. In this case, the p-type terminal well layer 51 and the p-type anode layer 25 have the same depth and the same p-type impurity concentration and may have configurations identical to each other. The p-type terminal well layer 51 and the p-type anode layer 25 may be formed through simultaneous ion injection of p-type impurities so that the p-type impurity concentration is different between the p-type terminal well layer 51 and the p-type anode layer 25. In this case, a mesh mask may be used as one or both of masks to obtain a changed opening ratio. Alternatively, the depth and the p-type impurity concentration may be made different between the p-type terminal well layer 51 and the p-type anode layer 25 by separately performing ion injection of p-type impurities into the p-type terminal well layer 51 and the p-type anode layer 25 through mask processing. The p-type terminal well layer 51, the p-type base layer 15, and the p-type anode layer 25 may be formed through simultaneous ion injection of p-type impurities.

Figure 12A:
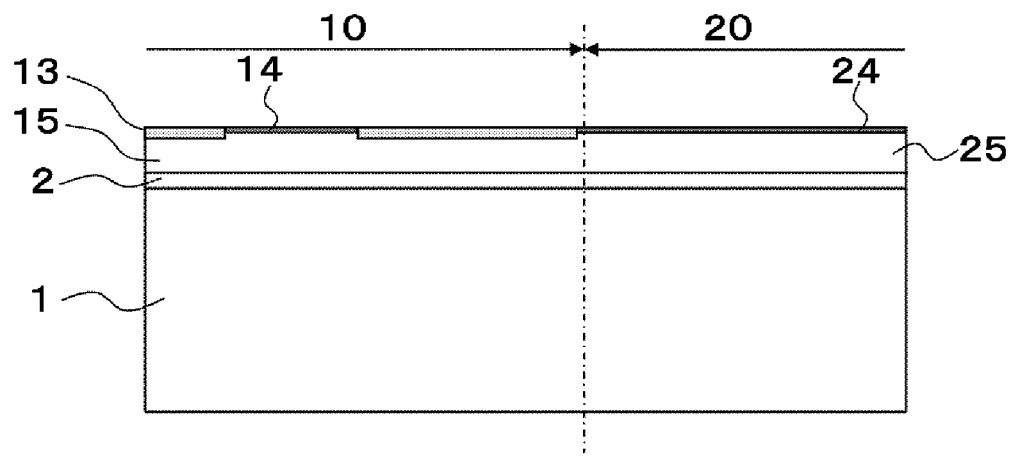
FIG. 12A and FIG. 12B are the second diagrams illustrating the method of manufacturing the semiconductor device of the first embodiment.

Subsequently, as illustrated in FIG. 12A, the $n^+$-type source layer 13 is formed by selectively injecting n-type impurities on the first principal surface side of the p-type base layer 15 in the IGBT region 10 through mask processing. The injected n-type impurities may be, for example, arsenic (As) or phosphorus (P). In addition, the p-type contact layer 14 is formed by selectively injecting aluminum as p-type impurities on the first principal surface side of the p-type base layer 15 in the IGBT region through mask processing. Moreover, the p-type contact layer 24 is formed by selectively injecting aluminum as p-type impurities on the first principal surface side of the p-type anode layer 25 in the diode region 20 through mask processing. In this case, the p-type contact layers 14 and 24 is formed to have a thickness smaller than that of the $n^+$-type source layer 13, for example, a thickness equal to or smaller than ½ of the thickness of the $n^+$-type source layer 13. The p-type contact layers 14 and 24 may be formed simultaneously or separately.

Figure 12B:
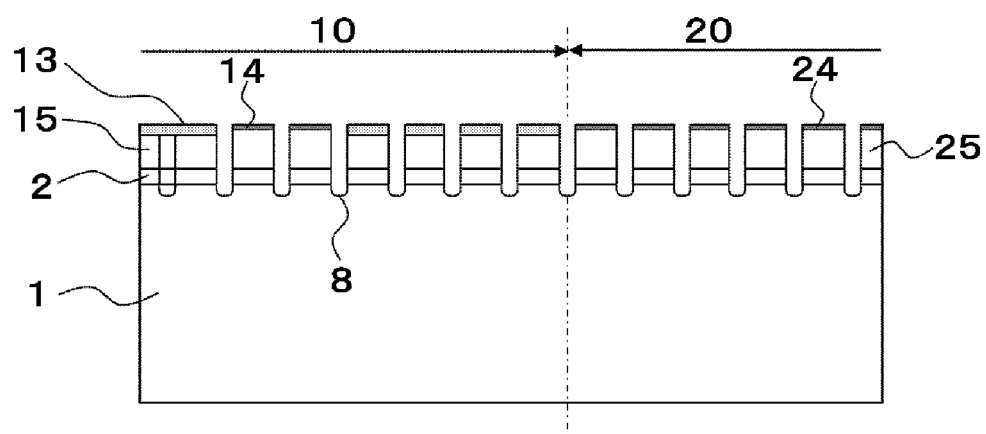

Subsequently, as illustrated in FIG. 12B, a trench 8 extending from the first principal surface side in the semiconductor substrate to the $n^-$-type drift layer 1 through the p-type base layer 15 and the p-type anode layer 25 is formed. In the IGBT region 10, the sidewall of the trench 8 penetrating through the $n^+$-type source layer 13 and the p-type contact layer 14 is partially formed by the $n^+$-type source layer 13 and the p-type contact layer 14. The trench 8 may be formed by accumulating an oxide film made of $SiO_2$ or the like on the semiconductor substrate, forming, through mask processing, an opening at part of the oxide film to be formed as the trench 8, and etching the semiconductor substrate by using, as a mask, the oxide film through which the opening is formed. The trenches 8 are formed at a pitch that is same in the IGBT region 10 and the diode region 20 in FIG. 12B, but the pitch of the trenches 8 may be different between the IGBT region 10 and the diode region 20. The pattern of the pitch of the trenches 8 in plan view can be changed as appropriate through a mask pattern in mask processing.

Figure 13A:
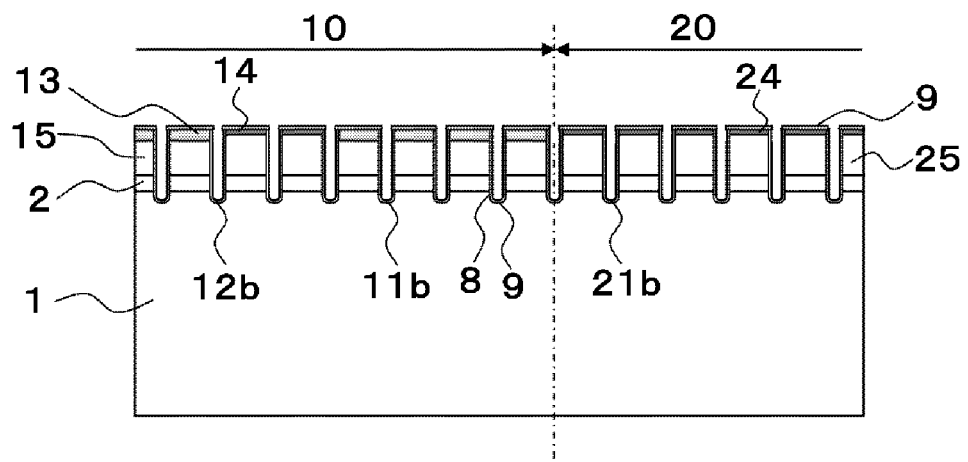
FIG. 13A and FIG. 13B are the third diagrams illustrating the method of manufacturing the semiconductor device of the first embodiment.

Subsequently, as illustrated in FIG. 13A, an oxide film 9 is formed on the inner wall of each trench 8 and the first principal surface of the semiconductor substrate by heating the semiconductor substrate in an atmosphere containing oxygen. The oxide film 9 formed on the inner wall of each trench 8 in the IGBT region 10 is the gate trench insulating film 11b of the active trench gate 11 and the dummy trench insulating film 12b of the dummy trench gate 12. The oxide film 9 formed in the trench 8 in the diode region 20 is the diode trench insulating film 21b. The oxide film 9 formed on the first principal surface of the semiconductor substrate is removed through a later process.

Figure 13B:
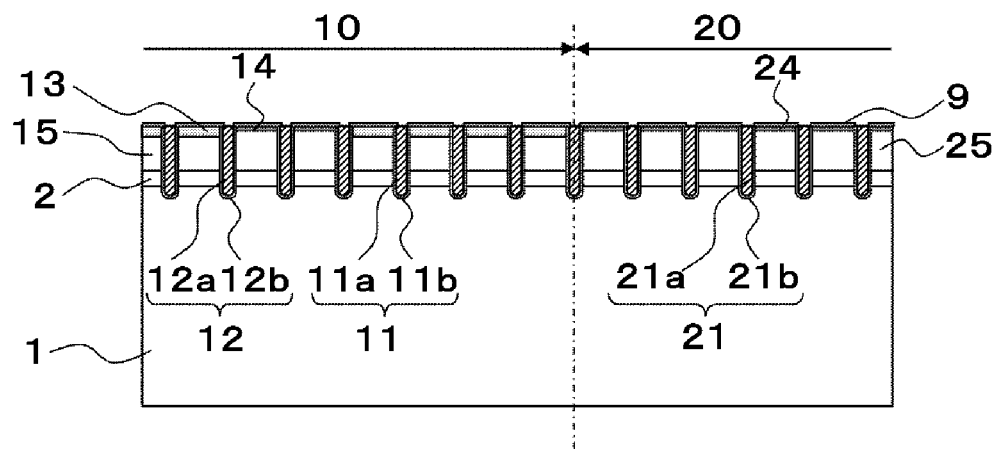

Subsequently, as illustrated in FIG. 13b, polysilicon doped with n-type or p-type impurities is accumulated in each trench 8, on the inner wall of which the oxide film 9 is formed, by chemical vapor deposition (CVD) or the like, thereby forming the gate trench electrode 11a, the dummy trench electrode 12a, and the diode trench electrode 21a.

Figure 14A:
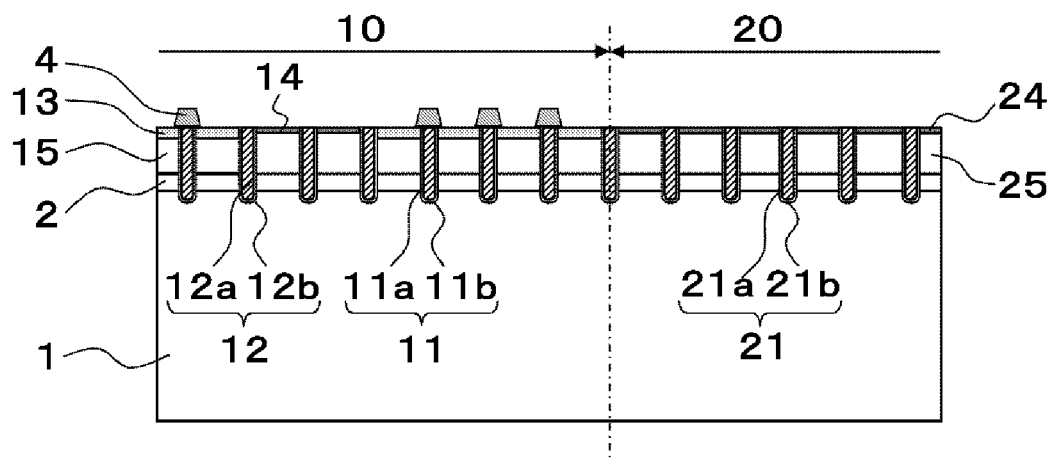
FIG. 14A and FIG. 14B are the fourth diagrams illustrating the method of manufacturing the semiconductor device of the first embodiment.

Subsequently, as illustrated in FIG. 14A, the interlayer insulating film 4 is formed on the gate trench electrode 11a of the active trench gate 11 in the IGBT region 10, and then the oxide film 9 formed on the first principal surface of the semiconductor substrate is removed. The interlayer insulating film 4 may be made of, for example, $SiO_2$. Then, contact holes are formed in the interlayer insulating film 4 accumulated through mask processing. The contact holes are formed on the $n^+$-type source layer 13, on the p-type contact layer 14, on the p-type contact layer 24, on the dummy trench electrode 12a, and on the diode trench electrode 21a.

Figure 14B:
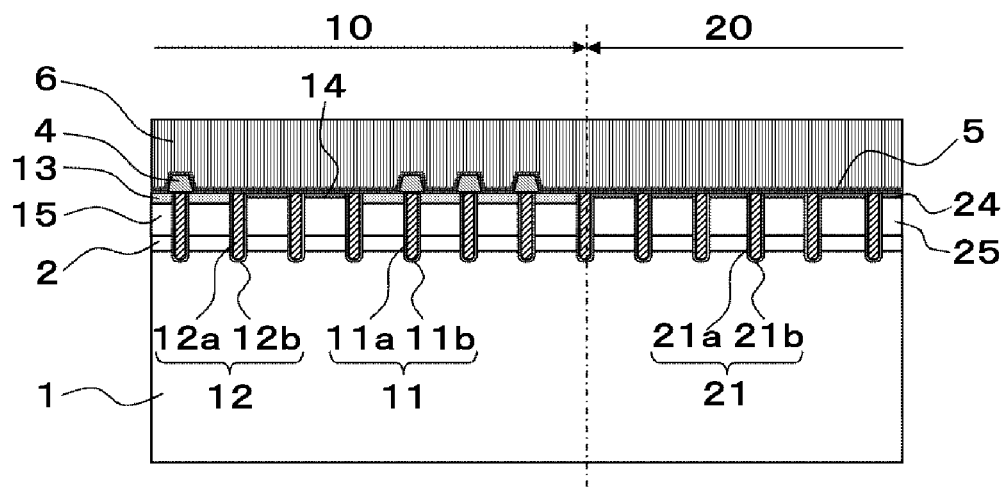

Subsequently, as illustrated in FIG. 14B, the barrier metal 5 is formed on the first principal surface of the semiconductor substrate and the interlayer insulating film 4, and in addition, the emitter electrode 6 is formed on the barrier metal 5. The barrier metal 5 is formed by producing a film of nitridation titanium through physical vapor deposition (PVD) or CVD.

The emitter electrode 6 may be formed by, for example, accumulating an aluminum-silicon alloy (Al—Si alloy) on the barrier metal 5 through PVD such as sputtering or evaporation coating. In addition, a nickel alloy (Ni alloy) may be formed on the formed aluminum-silicon alloy through non-electrolytic plating or electrolytic plating, thereby forming the emitter electrode 6. The emitter electrode 6 can be easily formed as a thick metal film by plating, and thus the heat capacity of the emitter electrode 6 can be increased to improve thermal resistance. When a nickel alloy is additionally formed through plating processing after the emitter electrode 6 made of an aluminum-silicon alloy is formed through PVD, the plating processing for forming the nickel alloy may be performed after fabrication of the second principal surface side in the semiconductor substrate.

Figure 15A:
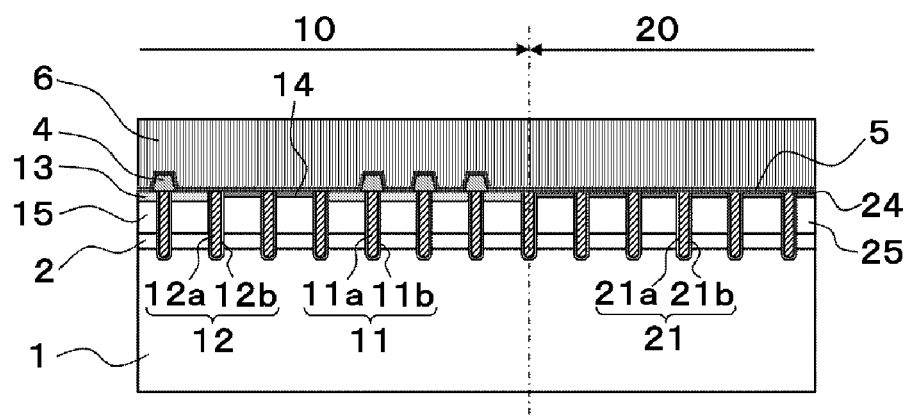
FIG. 15A and FIG. 15B are the fifth diagrams illustrating the method of manufacturing the semiconductor device of the first embodiment.

Subsequently, as illustrated in FIG. 15A, the second principal surface side in the semiconductor substrate is ground to reduce the thickness of the semiconductor substrate to a designed thickness. The thickness of the semiconductor substrate after the grinding may be, for example, 80 μm to 200 μm.

Figure 15B:
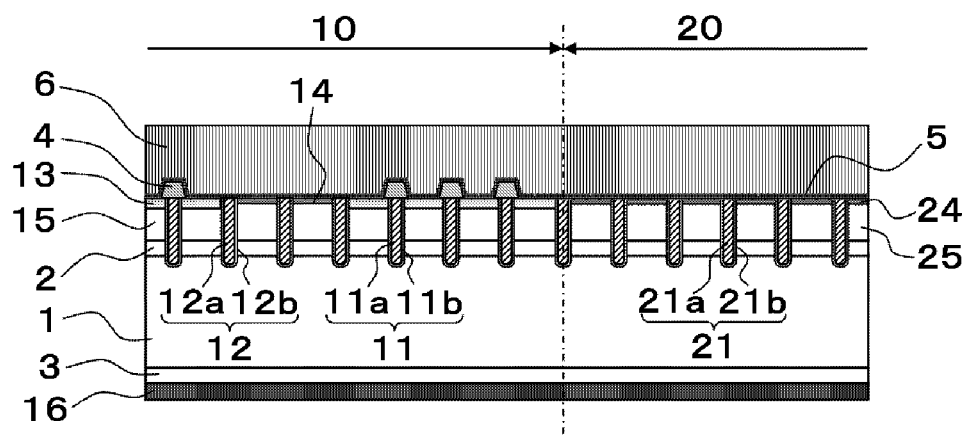

Subsequently, as illustrated in FIG. 15B, the n-type buffer layer 3 is formed by injecting n-type impurities from the second principal surface side in the semiconductor substrate. In addition, the p-type collector layer 16 is formed by injecting p-type impurities from the second principal surface side in the semiconductor substrate. The n-type buffer layer 3 may be formed in the IGBT region 10, the diode region 20, and the terminal region 30 or may be formed only in the IGBT region 10 or the diode region 20.

The n-type buffer layer 3 may be formed by injecting, for example, phosphorus (P) ions. Alternatively, the n-type buffer layer 3 may be formed by injecting protons (H+). Alternatively, the n-type buffer layer 3 may be formed by injecting both protons and phosphorus. Protons can be injected from the second principal surface of the semiconductor substrate to a deep position with relatively low acceleration energy. The depth to which protons are injected can be relatively easily changed by changing acceleration energy. Thus, when the n-type buffer layer 3 is formed by protons, the n-type buffer layer 3 having a larger width in the thickness direction of the semiconductor substrate than in a case of formation with phosphorus can be formed by performing injection a plurality of times while changing acceleration energy.

Moreover, the activation rate of phosphorus as n-type impurities can be set to be high as compared to protons, and thus it is possible to more reliably prevent punch-through of a depleted layer in the semiconductor substrate having a thickness reduced by forming the n-type buffer layer 3 of phosphorus. For further reduction of the thickness of the semiconductor substrate, it is preferable to form the n-type buffer layer 3 by injecting both protons and phosphorus, and in this case, protons are injected to deeper positions from the second principal surface than phosphorus.

The p-type collector layer 16 may be formed by injecting, for example, boron (B). The p-type collector layer 16 is formed in the terminal region 30 as well, and the p-type collector layer 16 in the terminal region 30 serves as the p-type terminal collector layer 16a. When boron ion injection is performed from the second principal surface side in the semiconductor substrate and then laser anneal is performed by irradiating the second principal surface with laser, the injected boron is activated, thereby forming the p-type collector layer 16. In this case, phosphorus for the n-type buffer layer 3, which is injected to relatively shallow positions from the second principal surface of the semiconductor substrate, is simultaneously activated. Since protons are activated at a relatively low annealing temperature of 380° C. to 420° C., it is needed to prevent the entire semiconductor substrate from being heated to a temperature higher than 380° C. to 420° C. after proton injection except for a process for proton activation. The laser annealing can increase temperature only at the vicinity of the second principal surface of the semiconductor substrate, and thus can be used to activate n-type and p-type impurities even after proton injection.

Figure 16A:
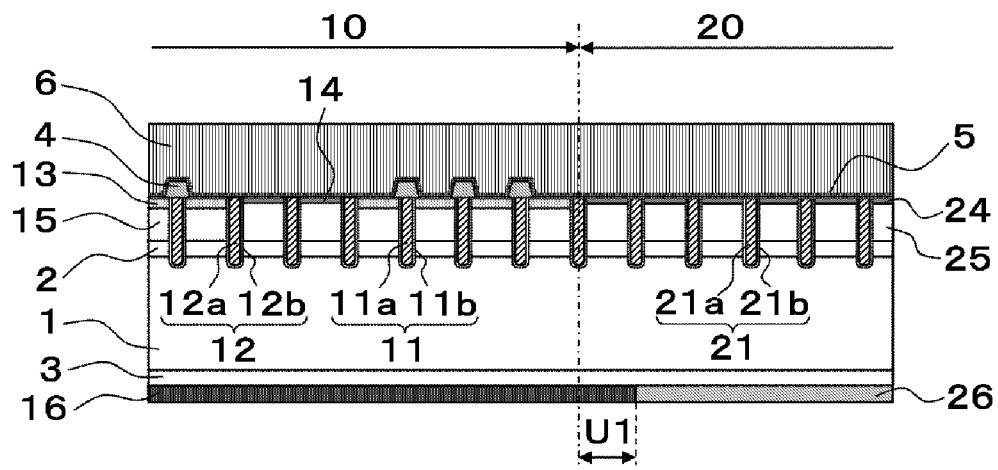
FIG. 16A and FIG. 16B are the sixth diagrams illustrating the method of manufacturing the semiconductor device of the first embodiment.

Subsequently, as illustrated in FIG. 16A, the $n^+$-type cathode layer 26 is formed in the diode region 20. The $n^+$-type cathode layer 26 may be formed by injecting, for example, phosphorus (P). Phosphorus is selectively injected from the second principal surface side by mask processing so that the boundary between the p-type collector layer 16 and the $n^+$-type cathode layer 26 is positioned at the distance U1 on the diode region 20 side of the boundary between the IGBT region 10 and the diode region 20 as illustrated in FIG. 16A. The amount of n-type impurity injection for forming the $n^+$-type cathode layer 26 is larger than the amount of p-type impurity injection for forming the p-type collector layer 16. Although the depths of the p-type collector layer 16 and the $n^+$-type cathode layer 26 from the second principal surface are equal to each other in FIG. 16A, the depth of the $n^+$-type cathode layer 26 is equal to or larger than the depth of the p-type collector layer 16. Since a region in which the $n^+$-type cathode layer 26 is formed needs to be an n-type semiconductor by injecting n-type impurities into a region in which p-type impurities are injected, the concentration of injected p-type impurities is set to be higher than the concentration of n-type impurities in the entire region in which the $n^+$-type cathode layer 26 is formed.

Figure 16B:
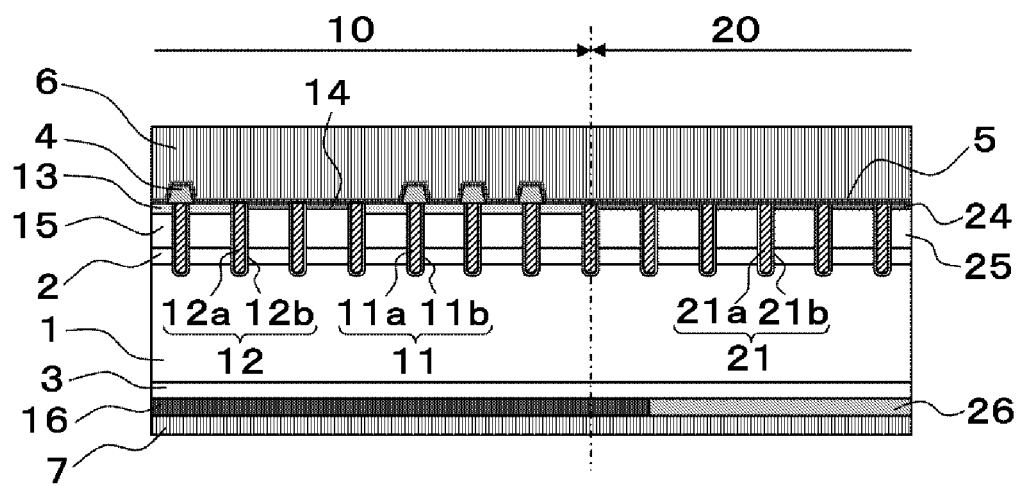

Subsequently, as illustrated in FIG. 16B, the collector electrode 7 is formed on the second principal surface of the semiconductor substrate. The collector electrode 7 is formed across the entire second principal surface in the IGBT region 10, the diode region 20, and the terminal region 30. The collector electrode 7 may be formed across the entire second principal surface of an n-type wafer as the semiconductor substrate. The collector electrode 7 may be formed by accumulating an aluminum-silicon alloy (Al—Si alloy), titanium (Ti), or the like through PVD such as sputtering or evaporation coating or may be formed by stacking a plurality of metals such as an aluminum-silicon alloy, titanium, nickel, and gold. Alternatively, the collector electrode 7 may be formed by forming, on a metal film formed through PVD, another metal film through non-electrolytic plating or electrolytic plating.

The semiconductor device 100 or the semiconductor device 101 is produced through the process described above. A plurality of semiconductor devices 100 or semiconductor devices 101 are produced in a matrix on one n-type wafer and divided into individuals by laser dicing or blade dicing, and accordingly, each semiconductor device 100 or semiconductor device 101 is completed.

Effects of the semiconductor device and the semiconductor device manufacturing method according to the present embodiment configured as described above will be described below.

In the semiconductor devices 100 and 101 according to the present embodiment, since aluminum is used as the p-type impurities of the p-type contact layer 14 and the p-type contact layer 24, the thicknesses of the p-type contact layer 14 and the p-type contact layer 24 can be set to be smaller than the thickness of the $n^+$-type source layer 13. This is because the atomic radius of aluminum is larger than that of boron and thus, when subjected to ion injection with the same acceleration energy, boron, which has the smaller atomic radius, is deeply injected but aluminum, which has the larger atomic radius, is injected shallower than boron. In addition, when aluminum, which is metal, is used as the p-type impurities, ohmic contact with an electrode part can be maintained, and thus it is possible to set the impurity concentration of each p-type contact layer to be lower than in a conventional semiconductor device, thereby preventing injection of a large amount of holes from the p-type contact layer 14 or the p-type contact layer 24 to the $n^-$-type drift layer 1 than in the conventional semiconductor device. As a result, the semiconductor devices 100 and 101 according to the present embodiment can reduce the recovery loss of the diode region 20 while lowering contact resistance.

Although the thicknesses of the p-type contact layers 14 and 24 are smaller than that of the $n^+$-type source layer 13 in the semiconductor devices 100 and 101 according to the present embodiment, the present disclosure is not limited thereto and it is only necessary that aluminum is used as the p-type impurities of the p-type contact layers 14 and 24. With this configuration, it is possible to maintain at least ohmic contact with an electrode part and thus lower the impurity concentration of each p-type contact layer, thereby reducing the recovery loss of the diode region 20 while lowering contact resistance.

Second Embodiment

Figure 17:
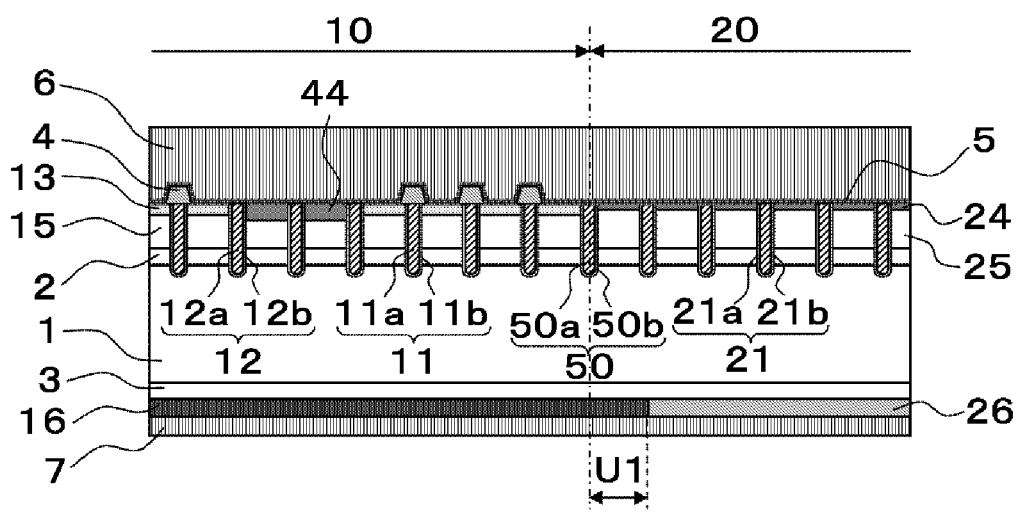
FIG. 17 is a G-G cross-sectional view illustrating the configuration of a boundary between the IGBT region and the diode region in the semiconductor device of the second embodiment.

The following describes a semiconductor device of a second embodiment with reference to FIG. 17. FIG. 17 is a cross-sectional view illustrating the configuration of the boundary between the IGBT and diode regions of the semiconductor device as an RC-IGBT. FIG. 17 corresponds to a cross-sectional view taken along the dashed line G-G in the semiconductor device 100 or the semiconductor device 101 illustrated in FIG. 1. FIG. 17 is a cross-sectional view at a site having a section in which the n$^+$-type source layer 13 is included as illustrated with the dashed line A-A in FIG. 3.

The semiconductor device according to the present embodiment is different from the semiconductor device 100 or 101 of the first embodiment in that the IGBT region 10 includes a p$^+$-type contact layer 44 having impurity concentration higher than that of the p-type contact layer 24 in the diode region 20. The other configuration of the semiconductor device according to the present embodiment is same as that of the semiconductor device 100 or 101 of the first embodiment, and thus the following description will be mainly made on difference from the semiconductor device 100 or 101.

Similarly to the first embodiment, the p-type contact layer 24 has a thickness smaller than that of the n$^+$-type source layer 13, and for example, has a thickness equal to ½ of the thickness of the n$^+$-type source layer 13. The impurity concentration of aluminum in the p-type contact layer 24 is preferably 1.0E+12/cm$^3$ to 1.0E+18/cm$^3$.

The p$^+$-type contact layer 44 is a semiconductor layer formed on the surface layer between trenches and containing boron as p-type impurities, and the concentration of the p-type impurities is 1.0E+15/cm$^3$ to 1.0E+20/cm$^3$. The impurity concentration of the p$^+$-type contact layer 44 is higher than that of the p-type contact layer 24. As illustrated in FIG. 17, the p$^+$-type contact layer 44 has a thickness larger than that of the n$^+$-type source layer 13, and for example, has a thickness 1.5 times larger than the thickness of the n$^+$-type source layer 13.

Although boron is preferably used as the p-type impurities of the p$^+$-type contact layer 44, the present disclosure is not limited thereto, and aluminum may be used or other p-type impurities may be used. In addition, the thickness of the p$^+$-type contact layer 44 is preferably larger than that of the n$^+$-type source layer 13, but may be equivalent to the thickness of the n$^+$-type source layer 13.

In the semiconductor device according to the present embodiment thus configured, since the impurity concentration of the p-type contact layer 24 formed in the diode region 20 is lower than that of the p$^+$-type contact layer 44 formed in the IGBT region 10, both recovery loss reduction and conduction property of the IGBT region can be achieved. The thickness of the p$^+$-type contact layer 44 in the IGBT region 10 is preferably larger than that of the n$^+$-type source layer 13 to promote hole flow into the p$^+$-type contact layer 44 and improve latch-up immunity in IGBT forward operation. The thick p$^+$-type contact layer can be formed by using boron or the like as impurities or setting the impurity concentration to be equal to or higher than 1.0E+15/cm$^3$.

Figure 18:
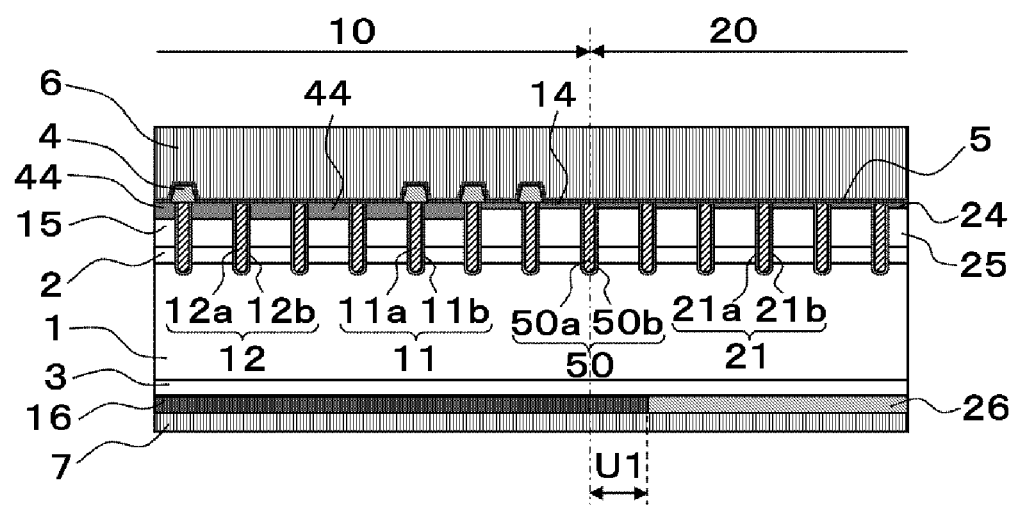
FIG. 18 is a G-G cross-sectional view illustrating the configuration of a boundary between the IGBT region and the diode region in a modification of the semiconductor device of the second embodiment.

The following describes a modification of the semiconductor device of the second embodiment with reference to FIG. 18. FIG. 18 corresponds to a cross-sectional view taken along the dashed line G-G in the semiconductor device 100 or the semiconductor device 101 illustrated in FIG. 1 but is a cross-sectional view from a position different from that of the cross-sectional view of FIG. 17. FIGS. 17 and 18 illustrate the configuration of the boundary between the IGBT and diode regions of the semiconductor device as an RC-IGBT. FIG. 17 is a cross-sectional view at a site having a section in which the n$^+$-type source layer 13 is included as illustrated with the dashed line A-A in FIG. 3. FIG. 18 is a cross-sectional view at a site having a section in which no n$^+$-type source layer 13 is included as illustrated with the dashed line B-B in FIG. 3.

The semiconductor device according to the modification of the present embodiment is different from the semiconductor device according to the present embodiment in that the p-type contact layer 14 is additionally formed on the IGBT region 10 side in the boundary region as illustrated in FIG. 18. The other configuration of the semiconductor device according to the modification is same as that of the semiconductor device according to the present embodiment, and thus the following description will be mainly made on difference.

The p-type contact layer 14 has a configuration same as that of the p-type contact layer 14 provided in the semiconductor device of the first embodiment and had a thickness smaller than that of the n$^+$-type source layer 13, preferably has a thickness equal to or smaller than ½ of the thickness of the n$^+$-type source layer 13. The impurity concentration of aluminum in the p-type contact layer 14 is preferably 1.0E+12/cm$^3$ to 1.0E+18/cm$^3$. In the semiconductor device according to the present embodiment, the p-type contact layer 14 is provided only on the IGBT region 10 side in the boundary region between the IGBT region 10 and the diode region 20.

In the second embodiment, the boundary between the IGBT region 10 and the diode region 20 is the position of a trench positioned most on the diode region 20 side among trenches in contact with the n$^+$-type source layer 13 at positions closest to the diode region 20 in the IGBT region 10. The trench positioned most on the diode region 20 side among trenches in contact with the n$^+$-type source layer 13 at positions closest to the diode region 20 in the IGBT region 10 may be referred to as a trench of the boundary or a boundary trench and is referred to as a boundary trench 50 in the following description. The boundary trench 50 is a trench that is formed in the semiconductor substrate and in which a boundary trench electrode 50a is provided through a boundary trench insulating film 50b.

In this manner, the p-type contact layer 14 is provided at a position close to the boundary trench 50 and the p$^+$-type contact layer 44 is provided at a position separated from the boundary trench 50. With this configuration, the number of holes injected into the n$^-$-type drift layer 1 from the p-type contact layer in the IGBT region 10 can be reduced near the boundary trench 50. Accordingly, the number of holes flowing from the IGBT region 10 into the diode region 20 can be reduced and the recovery loss of the diode region 20 can be further reduced.

Third Embodiment

Figure 19:
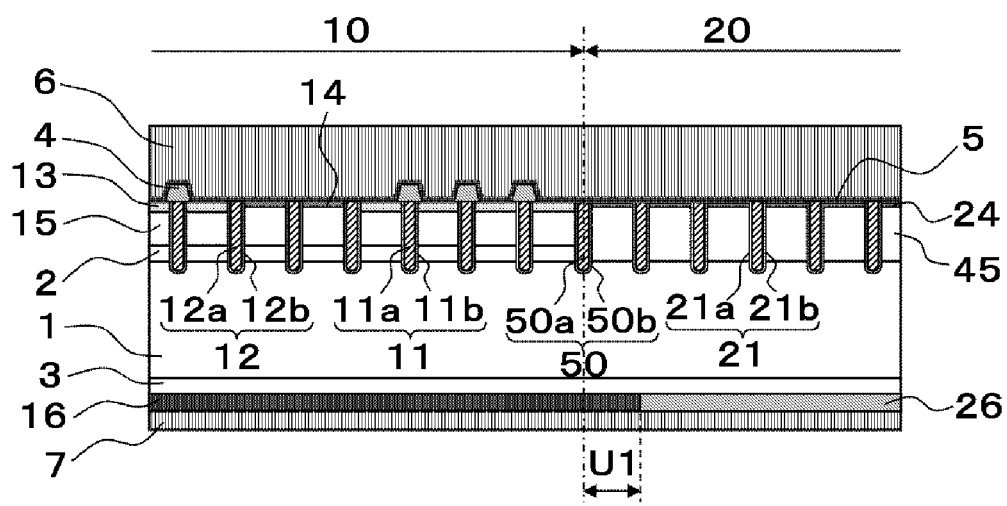
FIG. 19 is a G-G cross-sectional view illustrating the configuration of a boundary between the IGBT region and the diode region in the semiconductor device of the third embodiment.

The following describes a semiconductor device of a third embodiment with reference to FIG. 19. FIG. 19 is a cross-sectional view illustrating the configuration of the boundary between the IGBT and diode regions of the semiconductor device as an RC-IGBT. FIG. 19 corresponds to a cross-sectional view taken along the dashed line G-G in the semiconductor device 100 or the semiconductor device 101 illustrated in FIG. 1. FIG. 19 is a cross-sectional view at a site having a section in which the n$^+$-type source layer 13 is included as illustrated with the dashed line A-A in FIG. 3.

The semiconductor device according to the present embodiment is different from the semiconductor device 100 or 101 of the first embodiment in that a p$^-$-type anode layer 45 containing aluminum as p-type impurities is provided below the p-type contact layer 24 in the diode region 20 and no n-type carrier accumulation layer 2 is provided. The other configuration of the semiconductor device according to the present embodiment is same as that of the semiconductor device 100 or 101 of the first embodiment, and thus the following description will be mainly made on difference from the semiconductor device 100 or 101.

The p$^-$-type anode layer 45 contains aluminum as p-type impurities and has p-type impurity concentration lower than that of the p-type base layer 15 formed in the IGBT region 10. The impurity concentration of aluminum in the p$^-$-type anode layer 45 is 1.0E+12/cm$^3$ to 1.0E+17/cm$^3$. No n-type carrier accumulation layer 2 is formed below the p$^-$-type anode layer 45.

The p-type impurity concentration of the p$^-$-type anode layer 45 may be equivalent to that of the p-type base layer 15 formed in the IGBT region 10 but is preferably lower than that of the p-type base layer 15 to further reduce the recovery loss of the diode region 20.

In the semiconductor device according to the present embodiment thus configured, since the p-type contact layer 24 is formed at part of the surface layer between trenches and the p-type impurities of the p$^-$-type anode layer 45 is aluminum, hole injection from the p-type contact layer 24 and the p$^-$-type anode layer 45 can be suppressed and the recovery loss of the diode region 20 can be further reduced.

Fourth Embodiment

Figure 20:
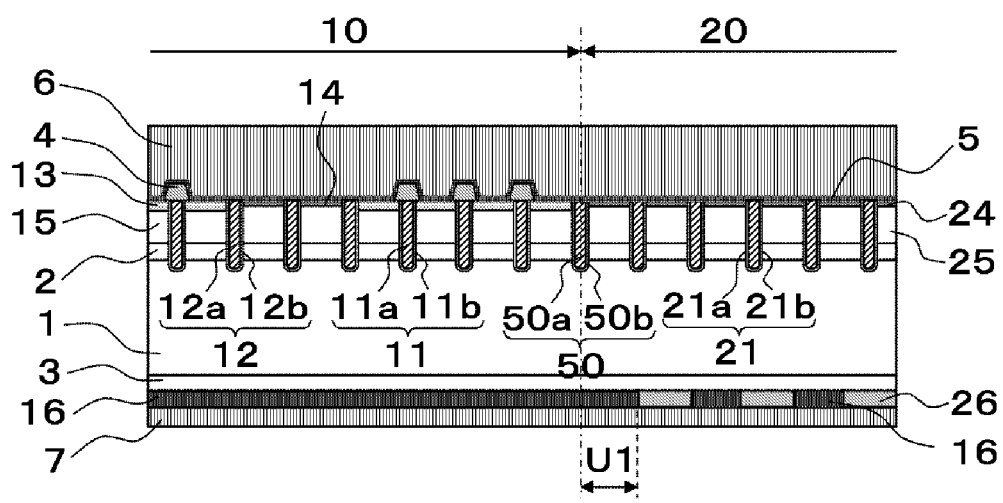
FIG. 20 is a G-G cross-sectional view illustrating the configuration of a boundary between the IGBT region and the diode region in the semiconductor device of the fourth embodiment.

The following describes a semiconductor device of a fourth embodiment with reference to FIG. 20. FIG. 20 is a cross-sectional view illustrating the configuration of the boundary between the IGBT and diode regions of the semiconductor device as an RC-IGBT. FIG. 20 corresponds to a cross-sectional view taken along the dashed line G-G in the semiconductor device 100 or the semiconductor device 101 illustrated in FIG. 1. FIG. 20 is a cross-sectional view at a site having a section in which the n$^+$-type source layer 13 is included as illustrated with the dashed line A-A in FIG. 3.

The semiconductor device according to the present embodiment is different from the semiconductor device 100 or 101 of the first embodiment in that the p-type collector layer 16 is scattered in the n$^+$-type cathode layer 26 in the diode region 20. The p-type collector layer 16 scattered in the n$^+$-type cathode layer 26 in the diode region 20 may be formed simultaneously with the p-type collector layer 16 in the IGBT region 10. The p-type collector layer 16 scattered in the n$^+$-type cathode layer 26 in the diode region 20 is in contact with the collector electrode 7 on the second principal surface side and is in contact with the n-type buffer layer 3 on the first principal surface side.

In the semiconductor device according to the present embodiment thus configured, an appropriate number of holes can be injected into the n$^-$-type drift layer in diode reverse operation, and thus diode performance further improves.

Fifth Embodiment

Figure 21:
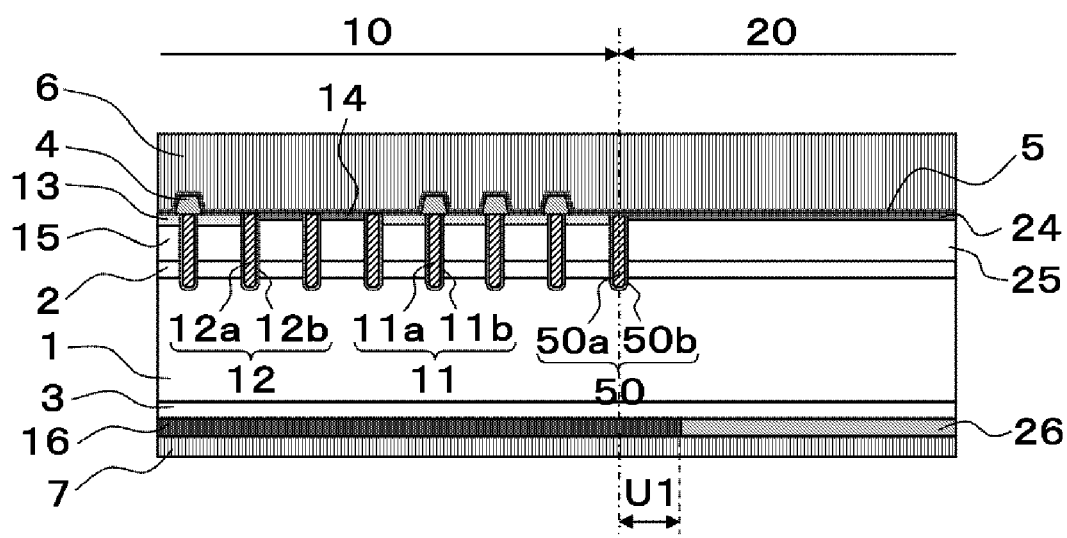
FIG. 21 is a G-G cross-sectional view illustrating the configuration of a boundary between the IGBT region and the diode region in the semiconductor device of the fifth embodiment.

The following describes a semiconductor device of a fifth embodiment with reference to FIG. 21. FIG. 21 is a cross-sectional view illustrating the configuration of the boundary between the IGBT and diode regions of the semiconductor device as an RC-IGBT. FIG. 21 corresponds to a cross-sectional view taken along the dashed line G-G in the semiconductor device 100 or the semiconductor device 101 illustrated in FIG. 1. FIG. 21 is a cross-sectional view at a site having a section in which the n$^+$-type source layer 13 is included as illustrated with the dashed line A-A in FIG. 3.

The semiconductor device according to the present embodiment is different from the semiconductor device 100 or 101 of the first embodiment in that no trench is formed in the diode region 20. The configuration "no trench is formed in the diode region 20" means a configuration in which the diode trench gate 21 described in the first embodiment is not included, and includes a configuration in which the boundary trench 50 is provided at the boundary between the IGBT region 10 and the diode region 20.

In the semiconductor device according to the present embodiment thus configured, since no trench is formed in the diode region 20, the area of carrier conduction increases to facilitate current flow, and thus on voltage can be reduced.

Sixth Embodiment

Figure 22:
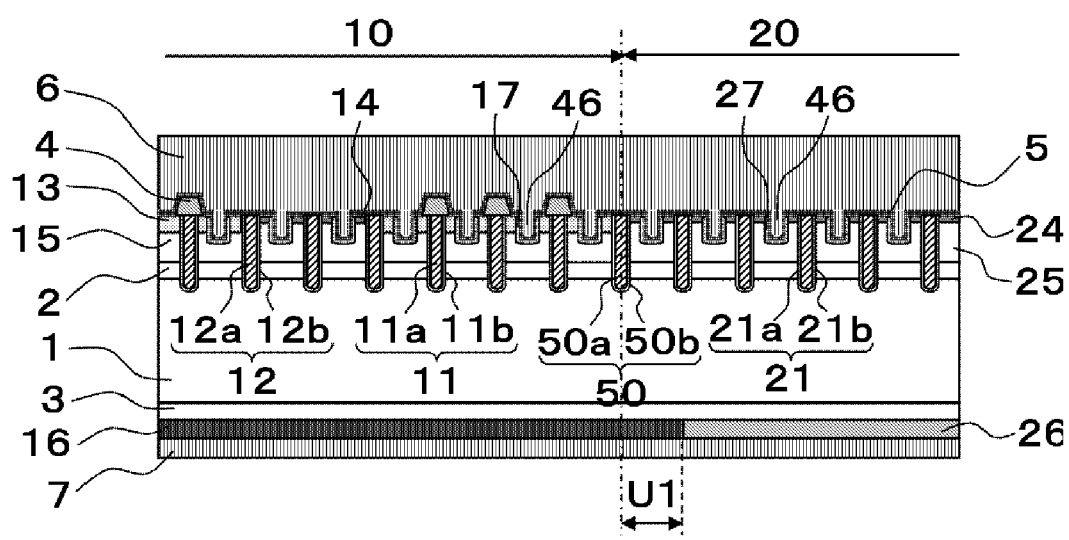
FIG. 22 is a G-G cross-sectional view illustrating the configuration of a boundary between the IGBT region and the diode region in the semiconductor device of the sixth embodiment.

The following describes a semiconductor device of a sixth embodiment with reference to FIG. 22. FIG. 22 is a cross-sectional view illustrating the configuration of the boundary between the IGBT and diode regions of the semiconductor device as an RC-IGBT. FIG. 22 corresponds to a cross-sectional view taken along the dashed line G-G in the semiconductor device 100 or the semiconductor device 101 illustrated in FIG. 1. FIG. 22 is a cross-sectional view at a site having a section in which the n$^+$-type source layer 13 is included as illustrated with the dashed line A-A in FIG. 3.

The semiconductor device according to the present embodiment is different from the semiconductor device 100 or 101 of the first embodiment in that a recessed trench contact 46 is provided between adjacent trenches. The other configuration of the semiconductor device according to the present embodiment is same as that of the semiconductor device 100 or 101 of the first embodiment, and thus the following description will be mainly made on difference from the semiconductor device 100 or 101.

In the semiconductor device according to the present embodiment, a trench contact 46 formed as a recess at the first principal surface is provided between adjacent trenches, and the emitter electrode 6 is embedded in the trench contact 46. A p-type contact layer 17 containing aluminum as p-type impurities is formed on the surface layer of the trench contact 46 on the IGBT region 10 side, and a p-type contact layer 27 containing aluminum as p-type impurities is formed on the surface layer of the trench contact 46 on the diode region 20 side. In addition, the barrier metal 5 is formed between the emitter electrode 6 in the trench contact 46 and the p-type contact layer 17 or the p-type contact layer 27. The trench contact 46 has a bottom part positioned on the second principal surface side of the n$^+$-type source layer 13. The trench contact 46 does not necessarily need to be formed between each pair of adjacent trenches.

In the semiconductor device according to the present embodiment thus configured, since the p-type contact layer 17 is positioned at the bottom part of the trench contact in the IGBT region 10, the effect of improving latch-up immunity can be obtained. In addition, the trench contact leads to a larger contact surface area, and thus contact resistance can be further lowered.

Combination, change, and omission of the embodiments as appropriate are included in the scope of the present disclosure.

In a semiconductor device according to the present disclosure, a second contact layer provided in the diode region of an RC-IGBT contains aluminum as p-type impurities, and thus the recovery loss of the diode region is reduced.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2020-164288, filed on Sep. 30, 2020 including specification, claims, drawings and summary, on which the Convention priority of the present application is based, are incorporated herein by reference in its entirety.

The invention claimed is:

1. A semiconductor device in which an insulated gate bipolar transistor region and a diode region are provided adjacent to each other in a semiconductor substrate including an n-type drift layer between a first principal surface and a second principal surface opposite to the first principal surface and an emitter electrode is provided on the first principal surface of the semiconductor substrate, wherein
the insulated gate bipolar transistor region includes
a p-type base layer provided on the first principal surface side of the drift layer,
an n-type source layer selectively provided on the first principal surface side of the base layer and at a surface layer of the semiconductor substrate on the first principal surface side, the source layer overlapping the base layer in a plan view, the source layer being spaced from a surface of the base layer, and the surface of the base layer being on the second principal surface side of the base layer,
a p-type first contact layer provided on the first principal surface side of the base layer and in a region in which the source layer is not provided on the surface layer of the semiconductor substrate on the first principal surface side, the first contact layer being connected with the emitter electrode, and the first contact layer being directly adjacent to the base layer,
a gate trench insulating film provided on an inner surface of a trench penetrating through the base layer to the drift layer,
a gate trench electrode provided in the trench through the gate trench insulating film, and
a p-type collector layer provided at a surface layer of the semiconductor substrate on the second principal surface side,
the diode region includes
a p-type anode layer provided on the first principal surface side of the drift layer,
a p-type second contact layer provided on the first principal surface side of the anode layer and at the surface layer of the semiconductor substrate on the first principal surface side and connected with the emitter electrode, and
an n-type cathode layer provided at the surface layer of the semiconductor substrate on the second principal surface side,
the second contact layer contains aluminum as p-type impurities, and
the thickness of the second contact layer is smaller than the thickness of the source layer.

2. The semiconductor device according to claim 1, wherein the impurity concentration of the second contact layer is lower than $1.0E+18/cm^3$.

3. The semiconductor device according to claim 1, wherein the first contact layer contains aluminum as p-type impurities.

4. The semiconductor device according to claim 3, wherein the impurity concentration of the first contact layer is lower than $1.0E+18/cm^3$.

5. The semiconductor device according to claim 3, wherein the thickness of the first contact layer is smaller than the thickness of the source layer.

6. The semiconductor device according to claim 1, comprising a plurality of the first contact layers, wherein at least one of the plurality of first contact layers is a third contact layer having impurity concentration higher than the impurity concentration of the second contact layer.

7. The semiconductor device according to claim 6, wherein
at least one of the plurality of first contact layers is a fourth contact layer having impurity concentration lower than the impurity concentration of the third contact layer, and
the fourth contact layer is positioned on the diode region side of the third contact layer.

8. The semiconductor device according to claim 6, wherein the thickness of the third contact layer is larger than the thickness of the source layer.

9. The semiconductor device according to claim 1, wherein
the anode layer contains aluminum as p-type impurities, and
the impurity concentration of the anode layer is lower than the impurity concentration of the second contact layer.

10. The semiconductor device according to claim 1, wherein the diode region does not include the trench.

11. The semiconductor device according to claim 1, wherein the emitter electrode is provided in contact with the source layer and the first contact layer.

12. The semiconductor device according to claim 1, wherein a copper layer or a copper alloy layer is formed on an aluminum alloy layer in the emitter electrode.

13. The semiconductor device according to claim 1, wherein
a trench contact formed as a recess at the first principal surface is provided between the trenches adjacent to each other, and
a surface layer of the trench contact is the first contact layer or the second contact layer.

14. The semiconductor device according to claim 1, wherein the p-type collector layer is scattered in the cathode layer.

15. The semiconductor device according to claim 1, wherein the semiconductor substrate is a bulk silicon substrate.

16. A semiconductor device in which an insulated gate bipolar transistor region and a diode region are provided adjacent to each other in a semiconductor substrate including an n-type drift layer between a first principal surface and a second principal surface opposite to the first principal surface and an emitter electrode is provided on the first principal surface of the semiconductor substrate, wherein
the insulated gate bipolar transistor region includes
a p-type base layer provided on the first principal surface side of the drift layer,
an n-type source layer selectively provided on the first principal surface side of the base layer and at a surface layer of the semiconductor substrate on the first principal surface side, the source layer being spaced from a surface of the base layer, and the surface of the base layer being on the second principal surface side of the base layer,
a p-type first contact layer provided on the first principal surface side of the base layer and in a region in which the source layer is not provided on the surface layer of the semiconductor substrate on the first principal surface side, the first contact layer being connected with the emitter electrode,
a gate trench insulating film provided on an inner surface of a trench penetrating through the base layer to the drift layer,
a gate trench electrode provided in the trench through the gate trench insulating film, and
a p-type collector layer provided at a surface layer of the semiconductor substrate on the second principal surface side,
the diode region includes
a p-type anode layer provided on the first principal surface side of the drift layer,
a p-type second contact layer provided on the first principal surface side of the anode layer and at the surface layer of the semiconductor substrate on the first principal surface side and connected with the emitter electrode, and
an n-type cathode layer provided at the surface layer of the semiconductor substrate on the second principal surface side,
the second contact layer contains aluminum as p-type impurities,
the thickness of the second contact layer is smaller than the thickness of the source layer, and
the thickness of the second contact layer is equal to or smaller than ½ of the thickness of the source layer.

17. A semiconductor device in which an insulated gate bipolar transistor region and a diode region are provided adjacent to each other in a semiconductor substrate including an n-type drift layer between a first principal surface and a second principal surface opposite to the first principal surface and an emitter electrode is provided on the first principal surface of the semiconductor substrate, wherein
the insulated gate bipolar transistor region includes
a p-type base layer provided on the first principal surface side of the drift layer,
an n-type source layer selectively provided on the first principal surface side of the base layer and at a surface layer of the semiconductor substrate on the first principal surface side, the source layer overlapping the base layer in a plan view, the source layer being spaced from a surface of the base layer, and the surface of the base layer being on the second principal surface side of the base layer,
a p-type first contact layer provided on the first principal surface side of the base layer and in a region in which the source layer is not provided on the surface layer of the semiconductor substrate on the first principal surface side, the first contact layer being connected with the emitter electrode, and the first contact layer being directly adjacent to the base layer,
a gate trench insulating film provided on an inner surface of a trench penetrating through the base layer to the drift layer,
a gate trench electrode provided in the trench through the gate trench insulating film, and
a p-type collector layer provided at a surface layer of the semiconductor substrate on the second principal surface side,
the diode region includes
a p-type anode layer provided on the first principal surface side of the drift layer,
a p-type second contact layer provided on the first principal surface side of the anode layer and at the surface layer of the semiconductor substrate on the first principal surface side and connected with the emitter electrode, and
an n-type cathode layer provided at the surface layer of the semiconductor substrate on the second principal surface side,
the second contact layer contains aluminum as p-type impurities,
the first contact layer contains aluminum as p-type impurities, and
the thickness of the first contact layer is smaller than the thickness of the source layer.

18. The semiconductor device according to claim 17, wherein the semiconductor substrate is a bulk silicon substrate.

19. A semiconductor device in which an insulated gate bipolar transistor region and a diode region are provided adjacent to each other in a semiconductor substrate including an n-type drift layer between a first principal surface and a second principal surface opposite to the first principal surface and an emitter electrode is provided on the first principal surface of the semiconductor substrate, wherein
the insulated gate bipolar transistor region includes
an n-type source layer selectively provided on the first principal surface side of the base layer and at a surface layer of the semiconductor substrate on the first principal surface side, the source layer being spaced from a surface of the base layer, and the surface of the base layer being on the second principal surface side of the base layer,
a p-type first contact layer provided on the first principal surface side of the base layer and in a region in which the source layer is not provided on the surface layer of the semiconductor substrate on the first principal surface side, the first contact layer being connected with the emitter electrode,
a gate trench insulating film provided on an inner surface of a trench penetrating through the base layer to the drift layer,
a gate trench electrode provided in the trench through the gate trench insulating film, and
a p-type collector layer provided at a surface layer of the semiconductor substrate on the second principal surface side,
the diode region includes
a p-type anode layer provided on the first principal surface side of the drift layer,
a p-type second contact layer provided on the first principal surface side of the anode layer and at the surface layer of the semiconductor substrate on the first principal surface side and connected with the emitter electrode, and an n-type cathode layer provided at the surface layer of the semiconductor substrate on the second principal surface side, the second contact layer contains aluminum as p-type impurities, the first contact layer contains aluminum as p-type impurities, the thickness of the first contact layer is smaller than the thickness of the source layer, and the thickness of the first contact layer is equal to or smaller than ½ of the thickness of the source layer.

* * * * *